United States Patent
Zhang

(10) Patent No.: US 12,035,525 B2
(45) Date of Patent: Jul. 9, 2024

(54) THREE-DIMENSIONAL NAND MEMORY DEVICE AND METHOD OF FORMING THE SAME

(71) Applicant: Yangtze Memory Technologies Co., Ltd., Hubei (CN)

(72) Inventor: Zhong Zhang, Wuhan (CN)

(73) Assignee: Yangtze Memory Technologies Co., Ltd., Wuhan (CN)

(*) Notice: Subject to any disclaimer, the term of this patent is extended or adjusted under 35 U.S.C. 154(b) by 812 days.

(21) Appl. No.: 17/113,538

(22) Filed: Dec. 7, 2020

(65) Prior Publication Data

US 2021/0375918 A1 Dec. 2, 2021

Related U.S. Application Data

(63) Continuation of application No. PCT/CN2020/093067, filed on May 29, 2020.

(51) Int. Cl.
*H10B 43/27* (2023.01)
*G11C 8/14* (2006.01)
(Continued)

(52) U.S. Cl.
CPC .............. *H10B 43/27* (2023.02); *G11C 8/14* (2013.01); *H10B 41/10* (2023.02); *H10B 41/27* (2023.02); *H10B 43/10* (2023.02)

(58) Field of Classification Search
CPC ........ H10B 43/27; H10B 41/10; H10B 41/27; H10B 43/10; H10B 43/50; H10B 43/35; G11C 8/14
See application file for complete search history.

(56) References Cited

U.S. PATENT DOCUMENTS 10,593,690 B2 3/2020 Lu et al.
2018/0286743 A1* 10/2018 Chang ................. H01L 23/5226
(Continued)

FOREIGN PATENT DOCUMENTS

CN 106910746 A 6/2017
CN 107068687 A 8/2017
(Continued)

OTHER PUBLICATIONS

International Search Report issued Feb. 25, 2021 in PCT/CN2020/093067 filed May 29, 2020, 4 pages.

*Primary Examiner* — Moazzam Hossain
(74) *Attorney, Agent, or Firm* — Oblon, McClelland, Maier & Neustadt, L.L.P.

(57) ABSTRACT

A semiconductor device has a stack formed of word line layers and insulating layers that are alternatingly arranged over a substrate. A first connection region is arranged between first array regions in the stack, and a first separation structure positioned along first sides of the first connection region and the first array regions. The first separation structure extends through the stack into the substrate. A second separation structure is positioned along opposing second sides of the first connection region and the first array regions. The second separation structure includes array separation structures positioned along the second sides of the first array regions and a connection separation structure positioned along the second side of the first connection region. The connection separating structure is arranged between and aligned with the array separation structures, and further extends through the stack into the substrate.

10 Claims, 22 Drawing Sheets

(51) Int. Cl.
*H10B 41/10* (2023.01)
*H10B 41/27* (2023.01)
*H10B 43/10* (2023.01)

(56) References Cited

U.S. PATENT DOCUMENTS

| | | |
|---|---|---|
| 2019/0057974 A1 | 2/2019 | Lu et al. |
| 2019/0221574 A1* | 7/2019 | Shimabukuro ........ H10B 43/35 |
| 2020/0058667 A1 | 2/2020 | Baek |
| 2020/0295025 A1 | 9/2020 | Lu et al. |

FOREIGN PATENT DOCUMENTS

| | | |
|---|---|---|
| CN | 108377660 A | 8/2018 |
| CN | 110114875 A | 8/2019 |
| CN | 111108600 A | 5/2020 |
| TW | 201926652 | 7/2019 |

* cited by examiner

US 12,035,525 B2

THREE-DIMENSIONAL NAND MEMORY DEVICE AND METHOD OF FORMING THE SAME

RELATED APPLICATION

This application is a bypass continuation of International Application No. PCT/CN2020/093067, filed on May 29, 2020. The entire disclosure of the prior application is hereby incorporated by reference in its entirety.

BACKGROUND

Flash memory devices have recently been through a rapid development. The flash memory devices are able to retain the stored data for a very long period of time without applying a voltage. Further, the reading rate of the flash memory devices is relatively high, and it is easy to erase stored data and rewrite data into the flash memory devices. Thus, the flash memory devices have been widely used in micro-computers, automatic control systems, and the like. To increase the bit density and reduce the bit cost of the flash memory devices, three-dimensional (3D) NAND (Not AND) flash memory devices have been developed.

A 3D NAND device can include one or more memory planes, and each of memory planes can include a plurality of memory blocks. Each of the memory blocks can have one or more array regions and one or more staircase regions. In such a 3D NAND device, a separation structure (e.g., a gate line slit structure) can be positioned between two memory blocks. In a first architecture of the 3D NAND device, a staircase region can be positioned between two array regions. In a second architecture of the 3D NAND device, an array region can be arranged between two staircase regions. The separation structure accordingly extends through the array regions and staircase regions of the 3D NAND device.

SUMMARY

In present disclosure, the inventive concepts relate to a novel structure of a 3D NAND device, and more particularly, to a connection region that is arranged between two array regions of a memory block of the 3D NAND device. A first separation structure (e.g., a dummy structure) is introduced to separate the connection region and second separation structures (e.g., gate line slit structures) are introduced to separate the array regions. The first separation structure and the second separation structure are aligned with each other.

In the present disclosure, a semiconductor device is provided. The semiconductor device can have a stack formed of word line layers and insulating layers that are alternatingly arranged in a vertical direction over a substrate. The semiconductor device can have a first connection region arranged between first array regions of a first memory block formed in the stack, and a first separation structure positioned along first sides of the first connection region and the first array regions. The first separation structure extends in the vertical direction through the stack into the substrate. The semiconductor device can also have a second separation structure positioned along opposing second sides of the first connection region and the first array regions. The second separation structure can include array separation structures positioned along the second sides of the first array regions and a connection separation structure positioned along the second side of the first connection region. The connection separating structure can be arranged between and aligned with the array separation structures, and further extend in the vertical direction through the stack into the substrate.

The connection separation structure can have a top-down profile. The top-down profile can have a straight profile that extends between the first array regions. The top-down profile can be a discontinuous profile that includes a first portion disposed adjacent to a first array separation structure of the array separation structures and a second portion disposed adjacent to a second array separation structure of the array separation structures. The top-down profile can have a curved profile that extends between the first array regions, an oval profile that extends between the first array regions, a square wave profile that extends between the first array regions, or a rectangle profile that extends between the first array regions.

In some embodiments, the connection separation structure can have a top-down profile that includes a first portion with a straight profile that is in direct contact with one a first array separation structure of the array separation structures, a second portion with the straight profile that is in direct contact with a second array separation structure of the array separation structures, and a third portion positioned between the first portion and the second portion. The third portion can have a profile that is one of an oval profile, a square profile, or a rectangle square.

In some embodiments, sidewalls of the connection separation structure can include protruding portions along a first direction. In another embodiment, the sidewalls of the connection separation structure can include first portions and second portions arranged alternatingly, and the second portions protrude along the first direction.

The connection separation structure can include at least one of SiN, SiO, or SiCN, and the array separation structures can include at least one of polysilicon, tungsten, cobalt, ruthenium, copper or aluminum.

The first connection region can include a first wall structure positioned along the first separation structure and extending between the first array regions, and a first staircase region positioned between the first wall structure and the connection separation structure and extending between the first array regions.

In some embodiments, the semiconductor device can further include a second connection region arranged between second array regions of a second memory block formed in the stack, and a third separation structure positioned along first sides of the second connection region and the second array regions. The third separation structure can further extend in the vertical direction through the stack into the substrate. The second separation structure can be positioned between the first memory block and the second memory block, and extend along opposing second sides of the second connection region and the second array regions. The array separation structures of the second separation structure can be positioned along the second sides of the second array regions, and arranged between the first array regions and the second array regions. The connection separation structure of the second separation structure can be positioned along the second side of the second connection region, and arranged between the first connection region and the second connection region.

The second connection region further can include a second wall structure positioned along the third separation structure and extending between the second array regions, and a second staircase region positioned between the second wall structure and the connection separation structure. The second staircase region can be disposed between the second array regions, and the second staircase region can be spaced apart from the first staircase region by the connection separation structure.

In some embodiments, the first staircase region further includes a plurality of first stairs and the second staircase region further includes a plurality of second stairs. The first stairs and the second stairs are aligned with each other along the vertical direction perpendicular to the substrate.

In some embodiments, the word line layers can further include a first word line layer. A first portion of the first word line layer that is disposed in the first array regions, the second array regions, the first wall structure, and the second wall structure can be made of a conductive material. In addition, a second portion of the first word line layer that is positioned in the first staircase region and the second staircase region can include conductive regions and a dielectric region, where the conductive regions and the dielectric region can be arranged side by side and extend along a top surface of the substrate. The dielectric region can be disposed between the conductive regions, and the conductive regions can be coupled to the first portion of the first word line layer. Further, the dielectric region of the second portion of the first word line layer can be treated by an implantation process.

According to another aspect of the disclosure, a method for fabricating a semiconductor device is provided. In the method, an initial stack can be formed. The initial stack can be formed of sacrificial word line layers and insulating layers that are alternatingly disposed in a vertical direction over a substrate of the semiconductor device. A connection region and array regions can be patterned in the initial stack. The connection region can be disposed between the array regions, and include a staircase region, a first wall structure, and a second wall structure that extend between the array regions. The staircase region can be disposed between the first wall structure and the second wall structure. A first separation structure can subsequently be formed to separate the staircase region of the connection region into a first staircase region and a second staircase region, where the first separation structure can be positioned between the array regions, and extend in the vertical direction through the initial stack into the substrate.

In the method, a second separation structure can also then be formed. The second separation structure can be positioned along first sides of the connection region adjacent to the first wall structure and the array regions. The second separation structure can also extend in the vertical direction through the initial stack into the substrate. A third separation structure can further be formed. The third separation structure can be positioned along second sides of the connection region adjacent to the second wall structure and the array regions. The third separation structure can extend in the vertical direction through the initial stack into the substrate.

In some embodiments, before the first separation structure is formed, a dielectric layer can be deposited over the staircase region. The dielectric layer can be positioned between the first wall structure and the second wall structure. The first separation structure can further extend in the vertical direction through the dielectric layer.

In some embodiments, in order to form the second separation structure and the third separation structure, a second separation trench can be formed along the first sides of the connection region and the array regions. The second separation trench can extend in the vertical direction through the initial stack into the substrate. In addition, a third separation trench can be formed along the second sides of the connection region and the array regions. The third separation trench can extend in the vertical direction through the initial stack into the substrate. The sacrificial word line layers that are positioned in the array regions, the first wall structure, and the second wall structure can then be removed to form first vacancies. In addition, side portions of the sacrificial word line layers that are positioned in tread positions of the staircase region can be removed to form second vacancies. The first vacancies and the second vacancies can subsequently be filled with a first conductive material to form word line layers.

In the method, array separation trenches can be formed. The array separation trenches can extend in the vertical direction through the initial stack into the substrate. The array separation trenches can be parallel to the second separation trench and the third separation trench to divide the array regions into first array regions and second array regions. The first separation structure can be positioned between and aligned with the array separation trenches. Further, a second conductive material can be deposited. The second conductive material can fill the second separation trench to form the second separation structure, fill the third separation trench to form the third separation structure, and fill the array separation trenches to form array separation structures.

In some embodiments, the first separation structure can have a top-down profile. The top-down profile can have a straight profile that extends between the array regions. The top-down profile can be a discontinuous profile that includes a first portion disposed adjacent to a first array separation structure of the array separation structures, and an opposing second portion disposed adjacent to a second array separation structure of the array separation structures. The top-down profile can also be a curved profile that extends between the array regions. The curved top-down profile can include a first portion with a straight top-down profile that is in direct contact with a first array separation structure of the array separation structures, a second portion with the straight top-down profile that is in direct contact with a second array separation structure of the array separation structures, and a third portion with the curved top-down profile that is disposed between the first portion and the second portion.

The top-down profile can be an oval profile that extends between the array regions. The oval top-down profile can include a first portion with a straight top-down profile that is in direct contact with a first array separation structure of the array separation structures, a second portion with the straight top-down profile that is in direct contact with a second array separation structure of the array separation structures, and a third portion with the oval top-down profile that is disposed between the first portion and the second portion. The top down profile can be a square wave profile that extends between the array regions, or a rectangle profile that extends between the array regions. The rectangle top-down profile can include a first portion with a straight top-down profile that is in direct contact with a first array separation structure of the array separation structures, a second portion with the straight top-down profile that is in direct contact with a second array separation structure of the array separation structures, and a third portion with the rectangle top-down profile that is disposed between the first portion and the second portion. Accordingly, sidewalls of the connection separation structure include first portions and second portions arranged alternatingly, where the second portions protrude along a first direction, and the connection separation structure includes at least one of SiN, SiO, or SiCN.

In the method, a plurality of word line contacts can be formed. The word line contacts can extend from the tread positions of the staircase region along the vertical direction perpendicular to the substrate, extend through the dielectric layer, and further be coupled to the word line layers positioned in the staircase region.

According to another aspect of the disclosure, a semiconductor is provided. The semiconductor device can include a stack. The stack can be formed of word line layers and insulating layers that are alternatingly disposed in a vertical direction over a substrate of the semiconductor device. The semiconductor device can have a connection region arranged between array regions formed in the stack, and a first separation structure positioned between the array regions to separate the connection region into a first connection region and a second connection region. The first separation structure can further extend in the vertical direction through the stack into the substrate. The semiconductor device can also have a second separation structure positioned along first sides of the connection region and the array regions. The second separation structure can extend in the vertical direction through the stack into the substrate. The semiconductor device further can have a third separation structure positioned along opposing second sides of the connection region and the array regions. The third separation structure can extend in the vertical direction through the stack into the substrate.

The semiconductor device can include array separation structures extending in the vertical direction through the stack into the substrate. The array separation structures can be parallel to the second separation structure and the third separation structure, and divide the array regions into first array regions and second array regions. The first separation structure can be arranged between and aligned with the array separation structures.

In some embodiments, the first separation structure can have a top-down profile. The top-down profile can have a straight profile that extends between the array regions. The top-down profile can be a discontinuous profile that includes a first portion disposed adjacent to a first array separation structure of the array separation structures, and a second portion disposed adjacent to a second array separation structure of the array separation structures. The top-down profile can also be a curved profile that extends between the array regions, an oval profile that extends between the array regions, a square wave profile that extends between the array regions, or a rectangle profile that extends between the array regions.

In some embodiments, the connection separation structure can have a top-down profile that comprises a first portion with a straight profile that is in direct contact with one a first array separation structure of the array separation structures, a second portion with the straight profile that is in direct contact with a second array separation structure of the array separation structures, and a third portion positioned between the first portion and the second portion, where the third portion has a profile that is one of an oval profile, a square profile, or a rectangle square profile.

In some embodiments, sidewalls of the connection separation structure include protruding portions along a first direction. In another embodiment, the sidewalls of the connection separation structure can include first portions and second portions arranged alternatingly, where the second portions protrude along the first direction.

In some embodiments, the first connection region can include a first staircase region and a first wall structure, and the second connection region can include a second staircase region and a second wall structure. The first wall structure can extend between the first array regions and be disposed along the second separation structure. The first staircase region can be positioned along the first wall structure and disposed between the first array regions. The second staircase region can be positioned along the first staircase region and disposed between the second array regions. The first separation structure can further be arranged between the first staircase region and the second staircase region. The second wall structure can be positioned between the second staircase region and the third separation structure, and further be disposed between the second array regions.

In some embodiments, the word line layers can further include a first word line layer. A first portion of the first word line layer that is disposed in the first array regions, the second array regions, the first wall structure, and the second wall structure can be made of a conductive material. In addition, a second portion of the first word line layer that is positioned in the first staircase region and the second staircase region can include conductive regions and a dielectric region, where the conductive regions and the dielectric region can be arranged side by side and extend along a top surface of the substrate. The dielectric region can be disposed between the conductive regions, and the conductive regions can be coupled to the first portion of the first word line layer. Further, the dielectric region of the second portion of the first word line layer can be treated by an implantation process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
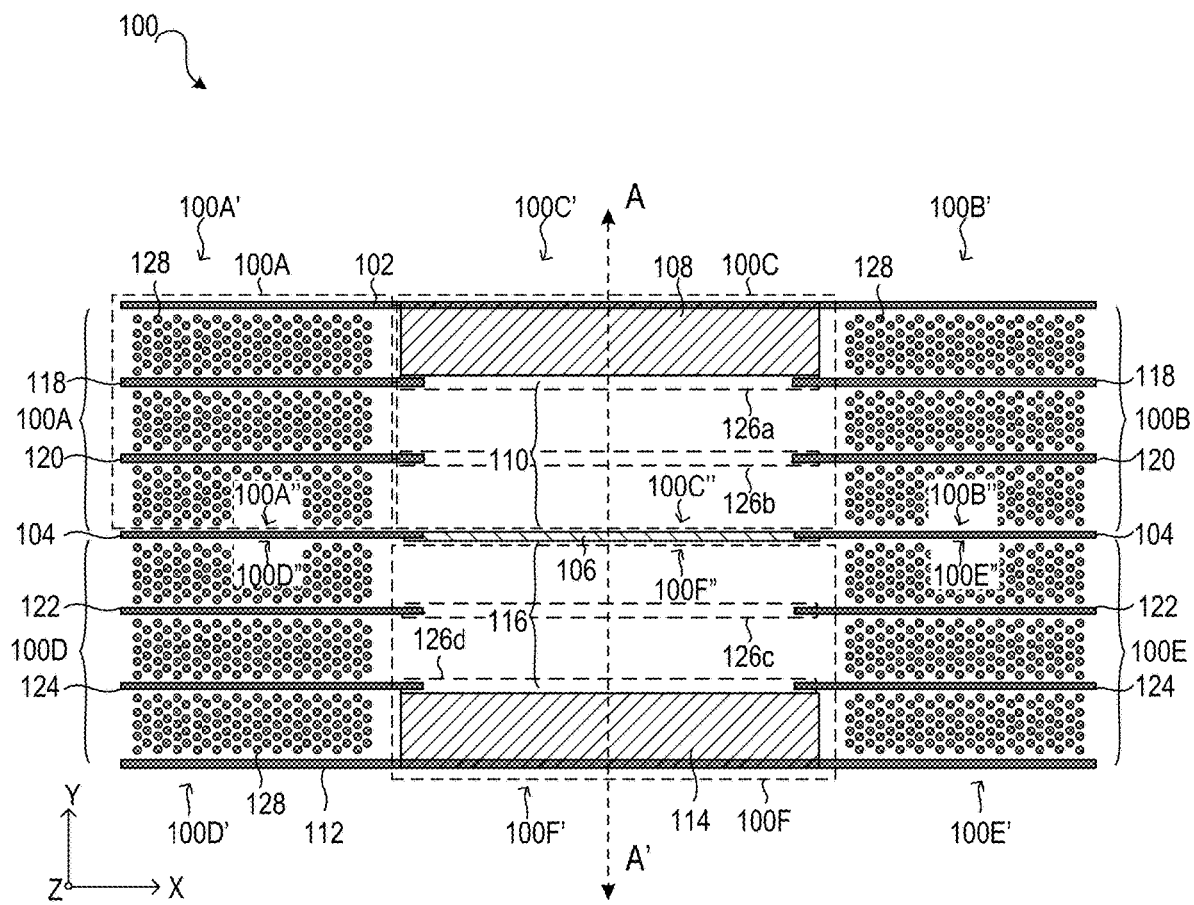
FIG. 1 is a top down view of a first exemplary 3D NAND device, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A 3D NAND device can include one or more memory planes, and each of memory planes can include a plurality of memory blocks. Each of the memory blocks can have two array regions and a connection region that is positioned between the two array regions. Accordingly, the 3D NAND device performs a center word line driving through the connection region that is positioned in a center position of the memory block. In such a 3D NAND device, a plurality of wall structures can be formed in connection regions, and the wall structures can be positioned between the array regions. In addition, staircase regions can be formed in the connection regions. The staircase regions can be positioned between the wall structures and further arranged between the array regions. Further, dielectric layers can be positioned in the connection region. The dielectric layers can be positioned over the staircase regions to fill in gaps between the wall structures.

In such a 3D NAND device, a plurality of separation structures (e.g., gate line slit structures) can be formed to separate the memory blocks. The separation structures can extend through the staircase regions and the array regions, and disposed in parallel to the wall structures. In some embodiments, voids can be formed in the dielectric layers that are positioned over the staircase regions and between the wall structures of the connection regions. The voids can cause an etch gouging or an undercut at bottom portions of the staircase regions during a formation of the separation structures.

In present disclosure, a connection separation structure (e.g., a dummy structure) can be introduced to separate the connection regions. Array separation structures (e.g., gate line slit structures) can be introduced to separate the array regions. The connection separation structure and the array separation structures are aligned with each other and positioned between two memory blocks. The etch gouging or the undercut driven by the voids can be prevented during a formation of the connection separation structure.

FIG. 1 is a top down view of a first exemplary 3D NAND device 100 (also referred to as device 100), in accordance with exemplary embodiments of the disclosure. As shown in FIG. 1, the device 100 can be formed in a stack including word line layers and insulating layers that are alternatingly arranged in a vertical direction (e.g., Z-direction) over a substrate (not shown). The device 100 can include a first connection region 100C arranged between first array regions 100A and 100B of a first memory block formed in the stack. The device 100 can also include a second connection region 100F disposed between second array regions 100D and 100E of a second memory block formed in the stack. A first separation structure (e.g., a first gate line slit (GLS) structure) 102 can be positioned along first sides of the first connection region 100C and the first array regions 100A and 100B. As shown in FIG. 1, the first side of the first connection region 100C can be 100C', and the first sides of the first array regions 100A and 100B can be 100A' and 100B' respectively. The first separation structure 102 can extend in the vertical direction (e.g., Z direction) through the stack into the substrate. The device 100 can also include a second separation structure positioned along opposing second sides of the first connection region 100C, and the first array regions 100A and 100B. The second side of the first connection region 100C can be 100C", and the second sides of the first array regions 100A and 100B can be 100A" and 100B" respectively.

The second separation structure can have array separation structures 104 positioned along the second sides 100A" and 100B" of the first array regions 100A and 100B, and a connection separation structure 106 positioned along the second side 100C" of the first connection region 100C. In some embodiment, the array separation structures can be GLS structures that extend through the stack into the substrate. The connection separating structure 106 can be a dummy structure with a straight top-down profile. The connection separating structure 106 can be arranged between and aligned with the array separation structures 104, and further extend in the vertical direction (e.g., Z direction) through the stack into the substrate. In some embodiments, the dummy structure can include a trench structure and a plurality of dummy channel structures that are disposed along the trench structure and spaced apart from one another. The dummy channel structures can have a pillar shape, such as an oval pillar shape or a circular pillar shape. Sidewalls of the dummy channel structures can protrude from sidewalls of the trench structure so that sidewalls of the connection separating structure 106 along the X direction can include flat surfaces and curved surfaces that are disposed alternatingly along the X direction. Accordingly, sidewalls of the dummy structure (or connection separation structure) comprise protruding portions (e.g., sidewalls of the dummy channel structures) along a first direction that is deviated from X direction, such as Y direction. In addition, the sidewalls of the dummy structure can include first portions (e.g., sidewalls of the trench structures) and second portions (e.g., sidewalls of the dummy channel structures) arranged alternatingly. The second portions protrude along the first direction (e.g., Y direction). In some embodiments, the dummy structure can include SiN, SiO, SiCN, or other suitable dielectric materials.

The first connection region 100C can have a first wall structure 108 positioned along the first separation structure 102 and extending between the first array regions 100A and 100B. The first connection region 100C can also have a first staircase region 110 positioned between the first wall structure 108 and the connection separation structure 106 and extending between the first array regions 100A and 100B.

The device 100 can include a second connection region 100F arranged between second array regions 100D and 100E of a second memory block formed in the stack. A third separation structure 112 (also refer to a third GLS structure) can be positioned along first sides of the second connection region 100F, and the second array regions 100D and 100E. As shown in FIG. 1, the first side of the second connection region 100F can be 100F', and the first sides of the second array regions 100D and 100E can be 100D' and 100E' respectively. The third separation structure 112 can further extend in the vertical direction through the stack into the substrate.

Still referring to FIG. 1, the second separation structure can be positioned between the first memory block and the second memory block. For example, the array separation structure 104 of the second separation structure can be positioned along second sides of the second array regions 100D and 100E, and arranged between the first array regions (e.g., 100A and 100B) and the second array regions (e.g., 100D and 100E). The second sides of the second array region 100D and 100E can be 100D" and 100E" respectively. The connection separation structure 106 of the second separation structure can be positioned along a second side 100F" of the second connection region 100F, and arranged between the first connection region 100C and the second connection region 100F.

The second connection region 100F can have a second wall structure 114 positioned along the third separation structure 112 and extending between the second array regions 100D and 100E. The second connection region 100F can also have a second staircase region 116 positioned between the second wall structure 114 and the connection separation structure 106. The second staircase region 116 can further be disposed between the second array regions 100D and 100E, and be spaced apart from the first staircase region 110 by the connection separation structure 106.

In some embodiments, the first staircase region 110 further includes a plurality of first stairs (not shown) and the second staircase region 116 further includes a plurality of second stairs (not shown). The first stairs and the second stairs are aligned with each other along the vertical direction perpendicular to the substrate.

The device 100 can include a plurality of GLS structures in the first array regions 100A and 100B, and the second array regions 100D and 100E. For example, two GLS structures 118 and 120 can be positioned in the first array regions 100A and 100B. The GLS structures 118 and 120 can extend in the vertical direction through the initial stack into the substrate. The GLS structure 118 and 120 can be arranged parallel to the first separation structure 102 and array separation structure 104 to separate the first array regions 100A and 100B into sub-blocks. Similarly, two GLS structures 122 and 124 can be positioned in the second array regions 100D and 100E. The GLS structures 122 and 124 can extend in the vertical direction through the initial stack into the substrate. The GLS structure 122 and 124 can be arranged parallel to the array separation structure 104 and the third separation structure 112 to separate the second array regions 100D and 100E into sub-blocks. In some embodiments, a gate-last fabrication technology is used to form the 3D NAND device 100. Thus the GLS structures are formed to assist in the removal of sacrificial word line layers, and the formation of the real gates. In some embodiments, the GLS structures can be made of conductive materials and positioned on array common source (ACS) regions to serve as contacts, where the ACS regions are formed in the substrate to serve as common sources. In some embodiments, the GLS structures can be made of dielectric materials to serve as separation structures.

The device 100 can further include a plurality of bottom select gate (BSG)-cut structures that are arranged in parallel to the first separation structure 102 and the third separation structure 112. For example, two BSG-cut structures 126a-126b are included in the first connection region 100C and two BSG-cut structures 126c-126d are included in the second connection region 100F. The BSG-cut structures 126 can extend through one or more bottom most word line layers and further be aligned with the GLS structures 118-124. For example, the BSG-cut 126a is aligned with the GLS structure 118. The BSG-cut structures 126 can be configured to divide the first array regions or the second array regions into sub-array regions for operation (e.g., erase, read or program).

The device 100 can have a plurality of channel structures 128 that are positioned in the first array regions 100A and 100B, and the second array regions 100D and 100E. The channel structures 128 can extend through the stack into the substrate. Each of the channel structures 128 can further include a channel layer, a tunneling layer that surrounds the channel layer, a charge trapping layer that surrounds the tunneling layer, and a barrier layer that surrounds the charge trapping layer and further is in direct contact with the word line layers. In some embodiments, a high-K layer, such as $HfO_2$ or AlO, can be disposed between the word line layers and the barrier layer.

In some embodiments, the device 100 can include a first memory block and a second memory block. The first memory block is formed of the first array regions 100A and 100B, and the first connection region 100C. The second memory block is formed of the second array regions 100D and 100E, and the second connection region 100F. The first memory block and the second memory block are spaced apart from one another by the second separation structure that include the array separation structures 104 and connection separation structure 106.

Figure 2:
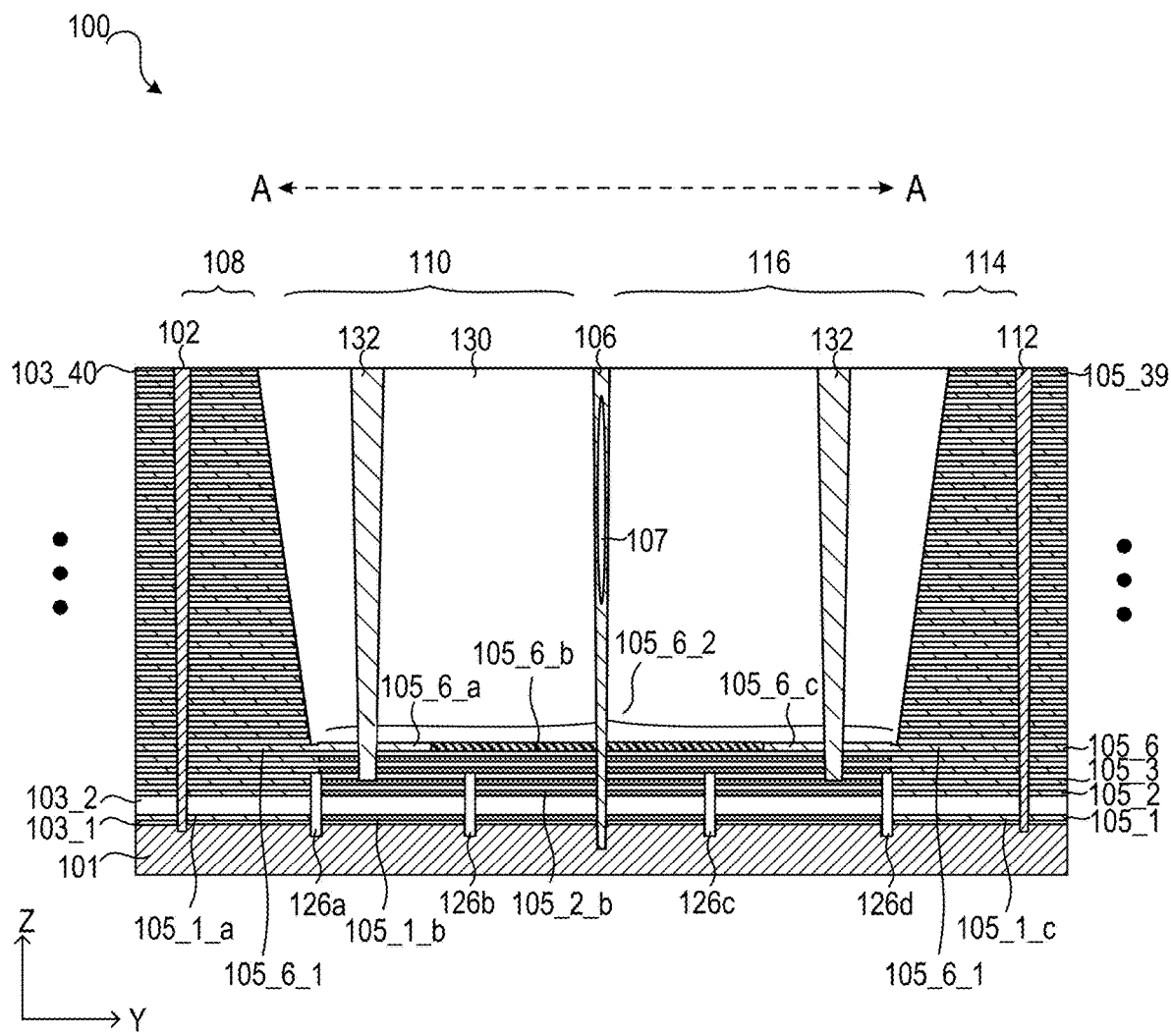
FIG. 2 is a cross-sectional view of the first exemplary 3D NAND device, in accordance with exemplary embodiments of the disclosure.

FIG. 2 is a cross-sectional view of the device 100 that is obtained from a plane same as a vertical plane containing line A-A' in FIG. 1. As shown in FIG. 2, the device 100 can include the stack that is formed of word line layers 105 and insulating layers 103. The word line layers 105 and the insulating layers 103 are stacked on the substrate 101 alternatingly. The first staircase region 110 and the second staircase region 116 are positioned between the first wall structure 108 and the second wall structure 114. The first separation structure 102 and the third separation structure 112 extend through the stack and further extend into the substrate 101. The connection separation structure 106 of the second separation structure can be positioned between the first staircase region 110 and the second staircase region 116. The first staircase region 110 and the second staircase region 116 can include a plurality of stairs. The stairs can be formed in the word line layers and the insulating layers that are positioned in the first staircase region 110 and the second staircase region 116. The connection separation structure 106 can extend through the word line layers and the insulating layers that are positioned in the first staircase region 110 and the second staircase region 116 and further extend into the substrate 101. In some embodiments, a dielectric layer 130 can be positioned over the first staircase region 110 and the second staircase region 116. The dielectric layer 130 can be arranged between the first wall structure 108 and the second wall structure 114. The connection separation structure 106 can extend through the dielectric layer 130 along the vertical direction (e.g., Z-direction).

In some embodiments, a void 107 can be positioned in the dielectric layer 130, such as in an interface region between the first staircase region 110 and the second staircase region 116. The void 107 can further be positioned in a top region of the connection separation structure 106. In the present disclosure, by controlling manufacturing processes (e.g., etching and deposition) and dimensions of the connection separation structure 106, an etching gouging or an undercut driven by the void 107 can be prevented.

Still referring to FIG. 2, the word line layers 105 can include conductive portions and dielectric portions. In a first example, the word line layer 105_39 can be made of a conductive material, such as tungsten (W) or polysilicon. In a second example, the word line layer 105_1 can include conductive portions 105_1_a and 105_1_c that are disposed in the first wall structure 108, and the second wall structure 114 respectively. The word line layer 105_1 can also have a dielectric portion 105_1_b that is positioned in the first staircase region 110 and the second staircase region 116. The conductive portions 105_1_a and 105_1_c can be made of W or polysilicon, and the dielectric portion 105_1_b can be made of SiN, for example. In a third example, the word line layer 105_6 can include first portions 105_6_1 and a second portion 105_6_2. The first portions 105_6_1 that are disposed in the first wall structure 108 and the second wall structure 114 can be made of the conductive material (e.g., W or polysilicon). The second portion 105_6_2 that is disposed in the first staircase region 110 and the second staircase region 116 can further include conductive regions (e.g., 105_6_a and 105_6_c) and a dielectric region (e.g., 105_6_b). The conductive regions and the dielectric region are arranged side by side and extend along a top surface of the substrate 101. The dielectric region is disposed between the conductive regions, and the conductive regions are further coupled to the first portions 105_6_1 of the word line layer 105_6 that is disposed in the first wall structure 108 and the second wall structure 114.

In some embodiments, the dielectric region 105_6_b of the second portion 105_6_2 in the word line layer 105_6 can be made of a doped dielectric material. For example, the dielectric region 105_6_b can be made of SiN that is doped by an ion implantation process. A doped dielectric material can have a different etch rate comparing to an un-doped dielectric material. In some embodiments, the second portion 105_6_2 of the word line layer 105_6 can be a tread portion of a stair in the first staircase region 110 and the second staircase region 116. The device 100 can have a plurality of word line contacts 132 that can extend from the tread portions of the first staircase region 110 and the second staircase region 116. The word line contacts 132 can extend along the vertical direction and further extend through dielectric layer 130. For example, two word line contacts 132 with a pillar shape can land on the conductive regions (e.g., 105_6_a and 105_6_c) of the second portion 105_6_2 of the word line layer 105_6 so as to be coupled to the word line layer 105_6. In some embodiment, the word line contacts 132 can further extend into dielectric portions of underlying word line layers (e.g., 105_3) in the first staircase region 110 and the second staircase region 116.

Still referring to FIG. 2, the BSG-cut structures 126 can extend through one or more bottom most word line layers (e.g., 105_1, 105_2 and 105_3), and further extend along the first separation structure 102 and the third separation structure 112.

In some embodiments, the first separation structure 102, the third separation structure 112, the array separation structures 104, and the GLS structures 118-124 can include polysilicon, tungsten, or other suitable conductive materials. The word line contacts 132 can include tungsten, Ti, TiN, Ta, TaN, ruthenium, cobalt, or other suitable conductive materials. The connection separation structure 106 can be a dummy structure that includes dummy channel structures with a pillar shape (e.g., circular-pillar shape or oval-pillar shape) and a trench structure, where the dummy channel structures are disposed along the trench structure. The connection separation structure 106 can be made of a dielectric material, such as SiO, SiN, SiCN, or other suitable dielectric materials. It should be noted that FIGS. 1 and 2 are merely examples. The device 100 can include any number of word line layers, any number of insulating layers, any number of word line contacts, and any number of channel structures.

Figure 3A:
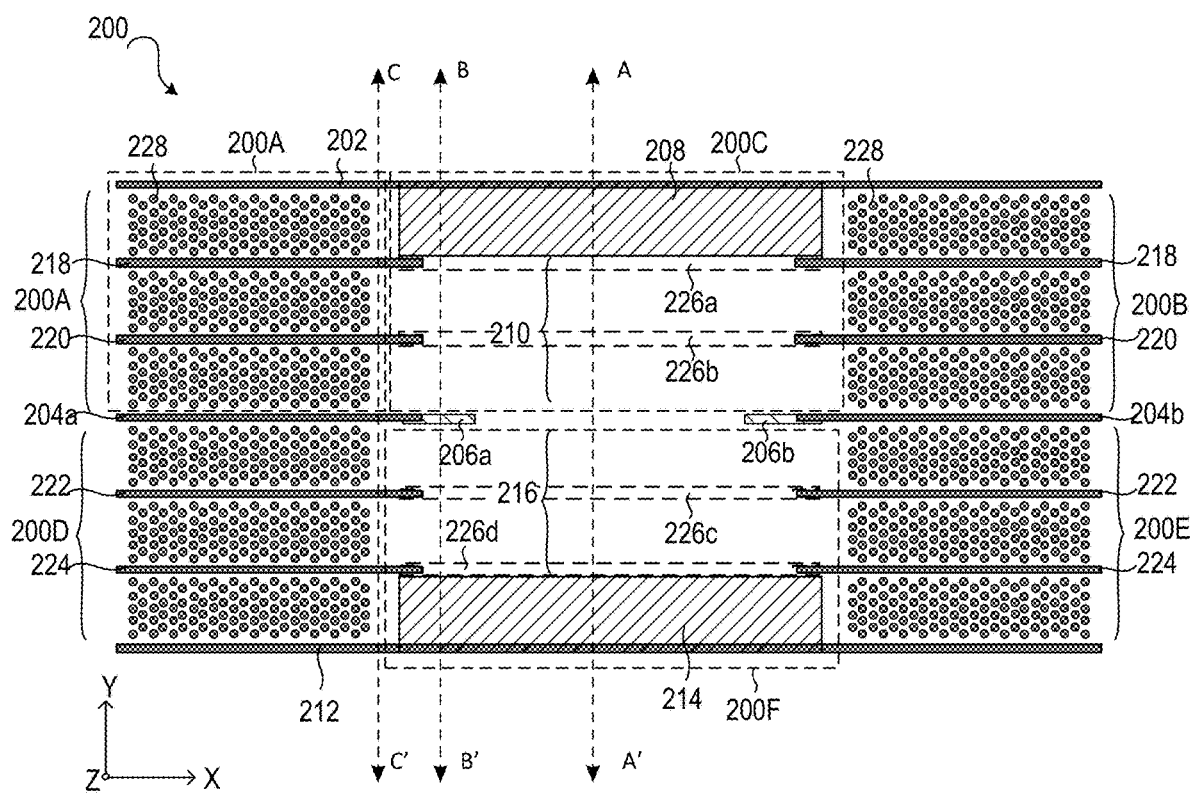
FIG. 3A is a top down view of a second exemplary 3D NAND device, in accordance with exemplary embodiments of the disclosure.

FIG. 3A is a top down view of a second exemplary 3D NAND device 200 (also referred to as device 200), in accordance with exemplary embodiments of the disclosure. Comparing to the device 100, the device 200 can have similar configurations. For example, the device 200 has first array regions 200A and 200B, and a first connection region 200C. The device 200 also has second array regions 200D and 200E, and a second connection region 200F. The device 200 has a first separation structure 202, a third separation structure 212, and GLS structures 218-224 positioned between the first separation structure 202 and the third separation structure 212. However, the device 200 can have a different second separation structure. The second separation structure of the device 200 can have array separation structures 204a and 204b, and connection separation structure 206. The connection separation structure 206 can have a discontinuous top-down profile that includes a first portion 206a disposed at a first corner of the first connection region 200C and adjacent to the array separation structure 204a, and a second portion 206b disposed at an opposing second corner of the first connection region 200C and adjacent to the array separation structure 204b. In some embodiments, the first portion 206a of the connection separation structure 206 can be overlapped with the array separation structure 204a, and the second portion 206b of the connection separation structure 206 can be overlapped with the array separation structure 204b.

Figure 3B:
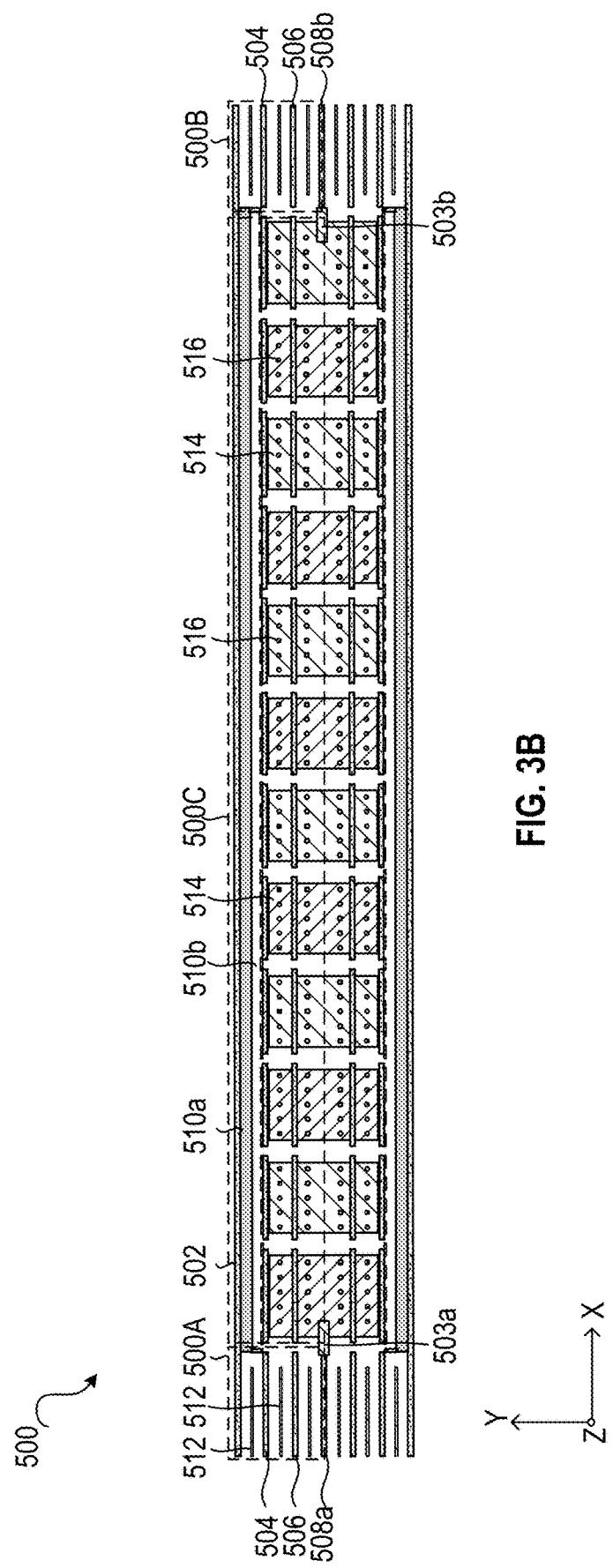
FIG. 3B is a top down view of a third exemplary 3D NAND device, in accordance with exemplary embodiments of the disclosure.

FIG. 3B is a top down view of a third exemplary 3D NAND device 500 (also referred to as device 500). As shown in FIG. 3B, the device 500 can have similar configurations to the device 200. For example, the device 500 can have first array regions 500A and 500B, and first connection region 500C. The device 500 can have a first separation structure 502 and a second separation structure that includes array separation structures 508a-508b and connection separation structures 503a-503b. However, GLS structures 504 and 506 of the device 500 can extend through not only the first array regions 500A and 500B, but also the first connection region 500C. It should be noted that wall structures of the device 500 can have a trapezoidal prism-shape. For example, a first wall structure can have a bottom base 510b and a top base 510a. The device 500 can have a plurality of connection staircases 514, and a plurality of word line contacts 516 can be formed on the connection staircases 514. The word line contacts 516 can extend from the connection staircases 514 along the Z-direction. The GLS structures 504 and 506 can be disposed in the connection staircases 514.

Figure 3C:
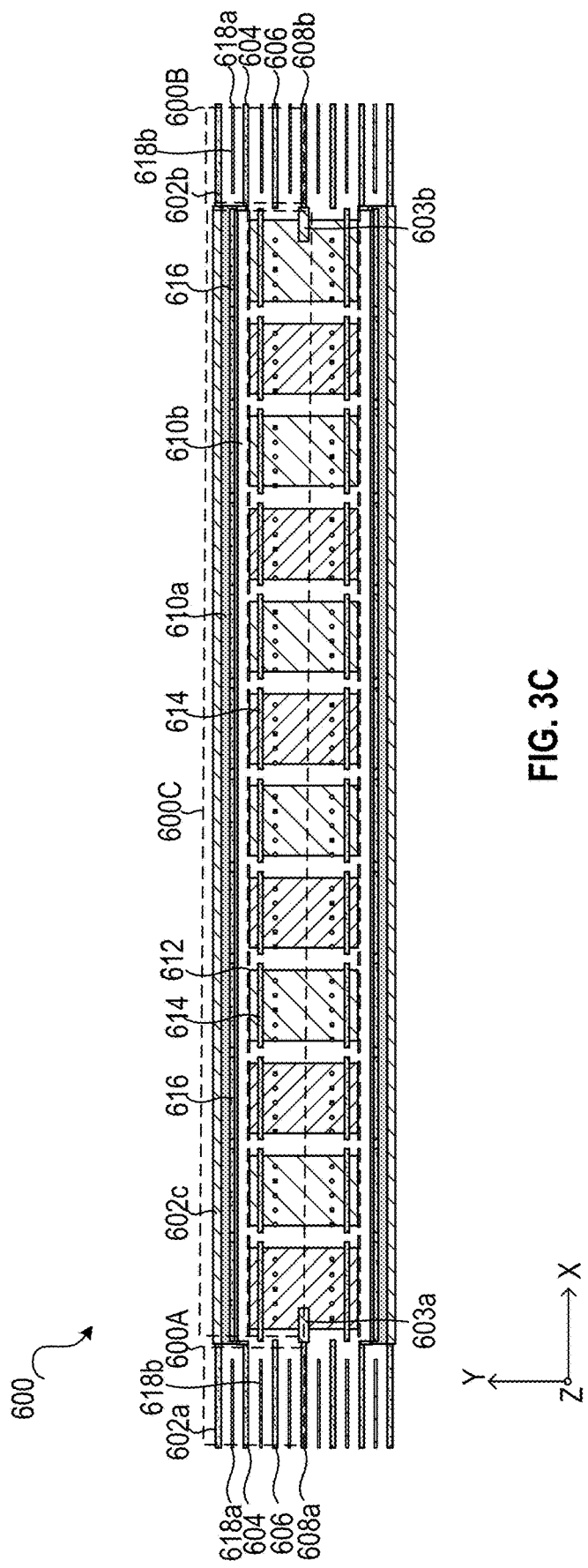
FIG. 3C is a top down view of a fourth exemplary 3D NAND device, in accordance with exemplary embodiments of the disclosure.

FIG. 3C is a top down view of a fourth exemplary 3D NAND device 600 (also referred to as device 600). The device 600 can have first array regions 600A-600B and first connection region 600C. The device 600 can have GLS structures 604 and 606 that are disposed in the first array regions 600A and 600B. The device 600 can also have a first separation structure 602, and a second separation structure that includes array separation structures 608a-608b and connection separation structures 603a-603b. The device 600 further includes a first wall structure with a trapezoidal prism-shape that has a bottom base 610b and a top base 610a. Comparing to the device 500 in FIG. 3B, the first separation structure 602 of the device 600 includes array portions 602a-602b and a connection portion 602c. The array portion 602a and the array portion 602b can be GLS structures and arranged along the first array region 600A and the first array region 600B respectively. The connection portion 602c can be a dummy structure and be arranged along the first connection region 600C. In addition, a GLS structure 616 can have a discontinuous profile and be arranged in the top base 610a of the first wall structure. In some embodiments, the GLS structure 616 can further be aligned with a BSG-cut structure 618a. Further, a plurality of GLS structures 614 can be disposed in connection staircases 612 of the first connection region 600C. Each of the GLS structure 614 can be arranged in a respective connection staircase 612. The GLS structures 614 can be aligned with each other along the X-direction. The GLS structures 614 can further be aligned with a BSG-cut structure 618b.

Figure 3D:
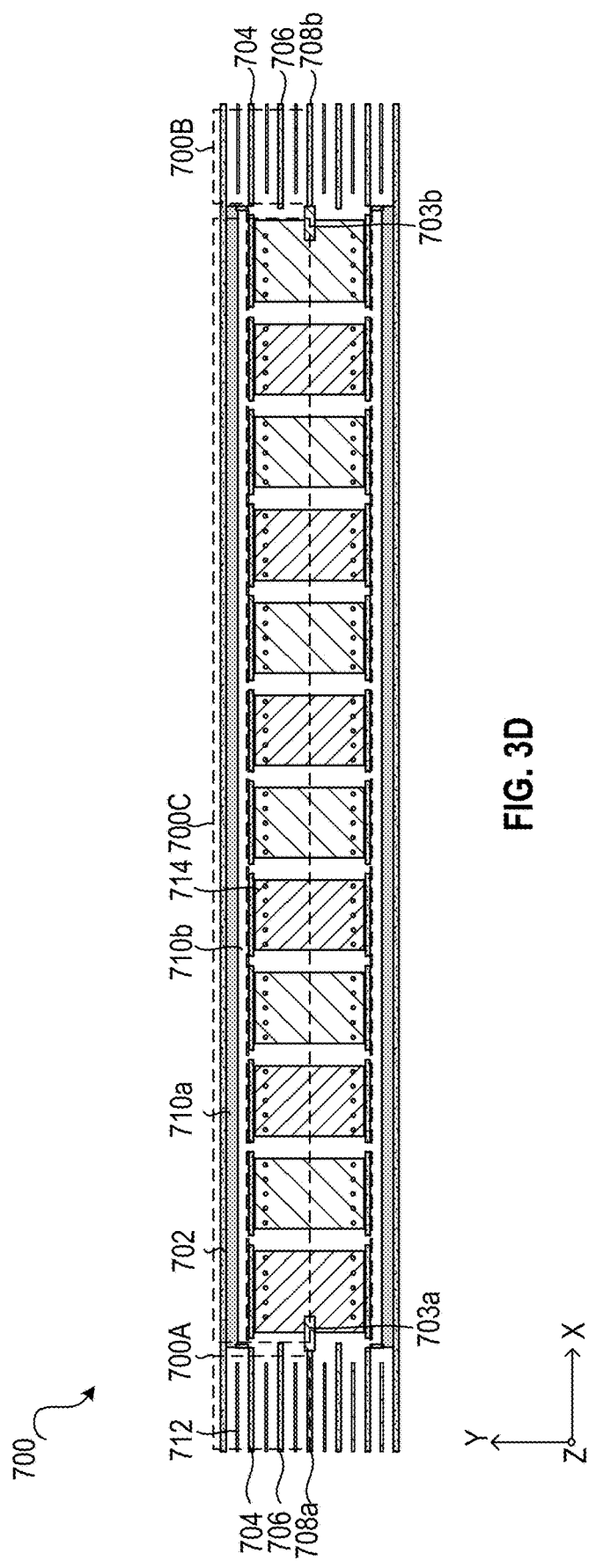
FIG. 3D is a top down view of a fifth exemplary 3D NAND device, in accordance with exemplary embodiments of the disclosure.

FIG. 3D is a top down view of a fifth exemplary 3D NAND device 700 (also referred to as device 700). The device 700 can have first array regions 700A-700B and first connection region 700C. The device 700 can have GLS structures 704 and 706 that are disposed in the first array regions 700A and 700B. The device 700 can also have a first separation structure 702, and a second separation structure that includes array separation structures 708a-708b and connection separation structures 703a-703b. The array separation structures 708a-708b can be GLS structures and the connection separation structure 703a-703b can be dummy structures. The device 700 further includes a first wall structure that has a bottom base 710b and a top base 710a. Comparing to the device 600 in FIG. 3C, the GSL structure 704 can further extend through connection staircases 714 of the first connection region 700C.

Figure 4A:
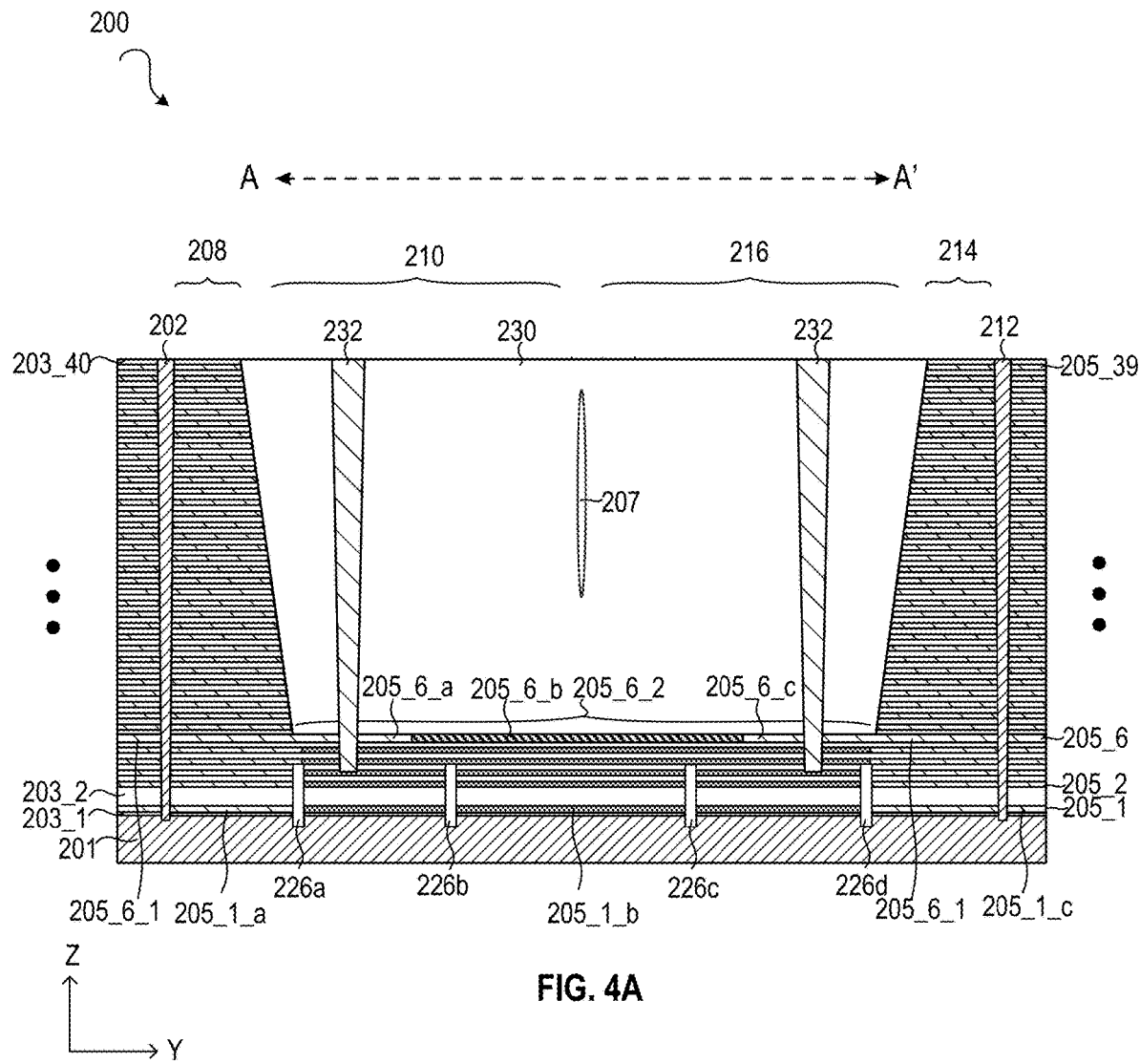
FIG. 4A is a first cross-sectional view of the second exemplary 3D NAND device, in accordance with exemplary embodiments of the disclosure.

FIG. 4A is a cross-sectional view of the device 200 that is obtained from a plane same as a vertical plane containing line A-A' in FIG. 3A. As shown in FIG. 4A, the device 200 can include a stack that is formed of word line layers 205 and insulating layers 203. The word line layers 205 and the insulating layers 203 are stacked on the substrate 201 alternatingly. Similar to the device 100, the word line layers 205 can include conductive portions and dielectric portions. For example, the word line layer 205_39 can be made of a conductive material, such as tungsten (W) or polysilicon. The word line layer 205_1 can include conductive portions 205_1_a and 205_1_c that are disposed in the first wall structure 208, and the second wall structure 214 respectively. The word line layer 205_1 can also have a dielectric portion 205_1_b that is positioned in the first staircase region 210 and the second staircase region 216. The word line layer 205_6 can include first portions 205_6_1 and a second portion 205_6_2. The first portions 205_6_1 that are disposed in the first wall structure 208 and the second wall structure 214 can be made of the conductive material. The second portion 205_6_2 that is disposed in the first staircase region 210 and the second staircase region 216 can further include conductive regions (e.g., 205_6_a and 205_6_c) and a dielectric region (e.g., 205_6_b). Similar to 105_6_b in the device 100, the dielectric portion 205_6_b can also receive an ion implantation process.

It should be noted that the first portion 206a of the connection separation structure 206 can extend along the X direction to a certain distance so as to separate conductive regions of the word line layers in the first staircase region 210 and the second staircase region 216. Similarly, the second portion 206b of the connection separation structure 206 can extend along the –X direction to a certain distance so as to separate conductive regions of the word line layers in the first staircase region 210 and the second staircase region 216.

A dielectric layer 230 can be positioned between the first wall structure 208 and a second wall structure 214. The dielectric layer 230 can also be positioned over the first staircase region 210 and the second staircase region 216. In some embodiments, a void 207 can be positioned in a top portion of the dielectric layer 230 when the dielectric layer 230 is formed to fill gaps between the first wall structure 208 and a second wall structure 214. As shown in FIGS. 3A and 4A, the connection separation structure 206 has a discontinuous profile in that the connection separation structure 206 does not extend through the void 207. Thus the void 207 can be intact in the top portion of the dielectric layer 230 during the formation of the connection separation structure 206. It should be noted that first staircase region 210 and the second staircase region 216 can be electrically isolated through the dielectric portions of the word line layers, such as the dielectric region 205_6_b of the word line layer 205_6 and the dielectric portion 205_1_b of the word line layer 205_1.

Figure 4B:
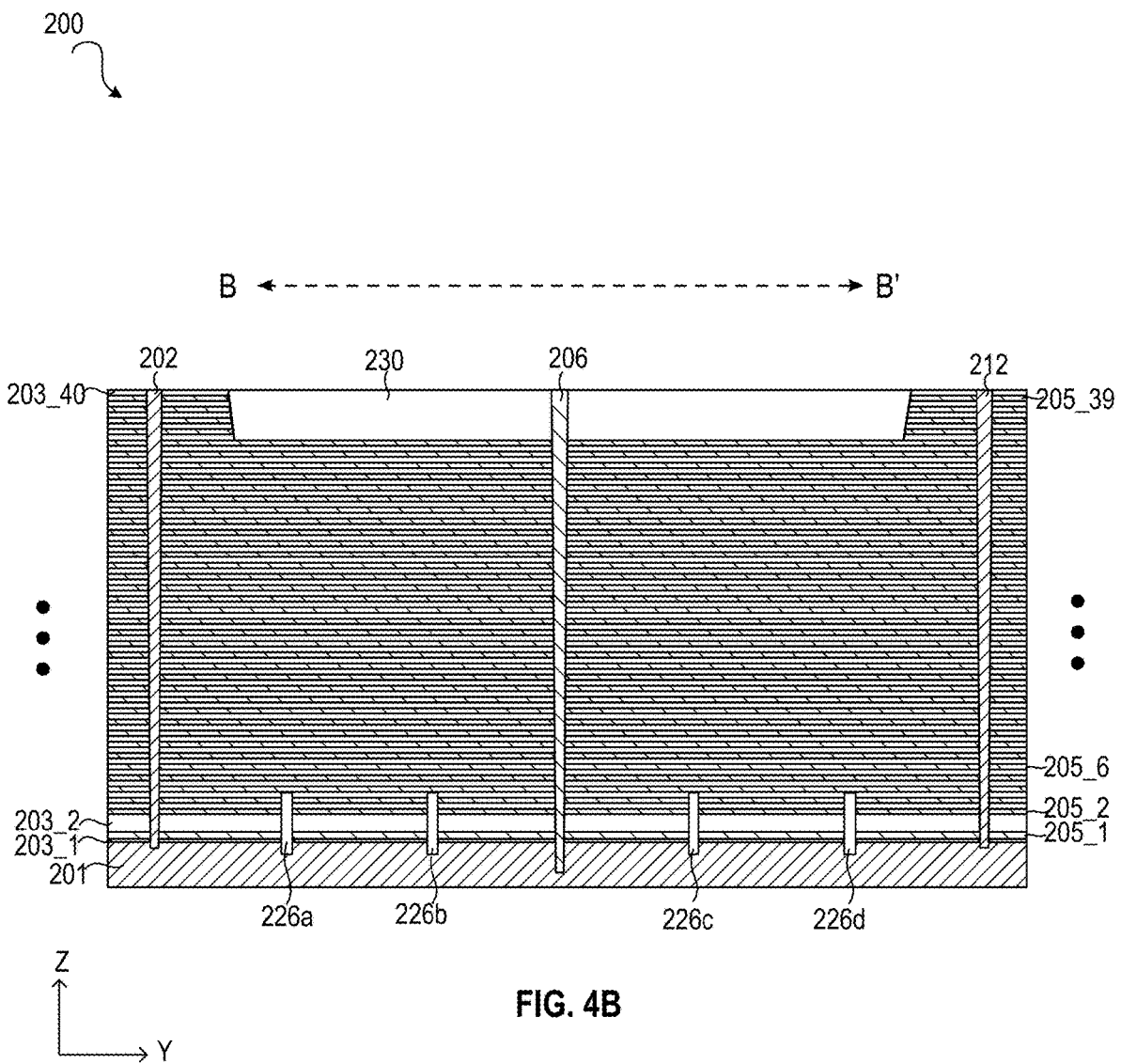
FIG. 4B is a second cross-sectional view of the second exemplary 3D NAND device, in accordance with exemplary embodiments of the disclosure.
Figure 4C:
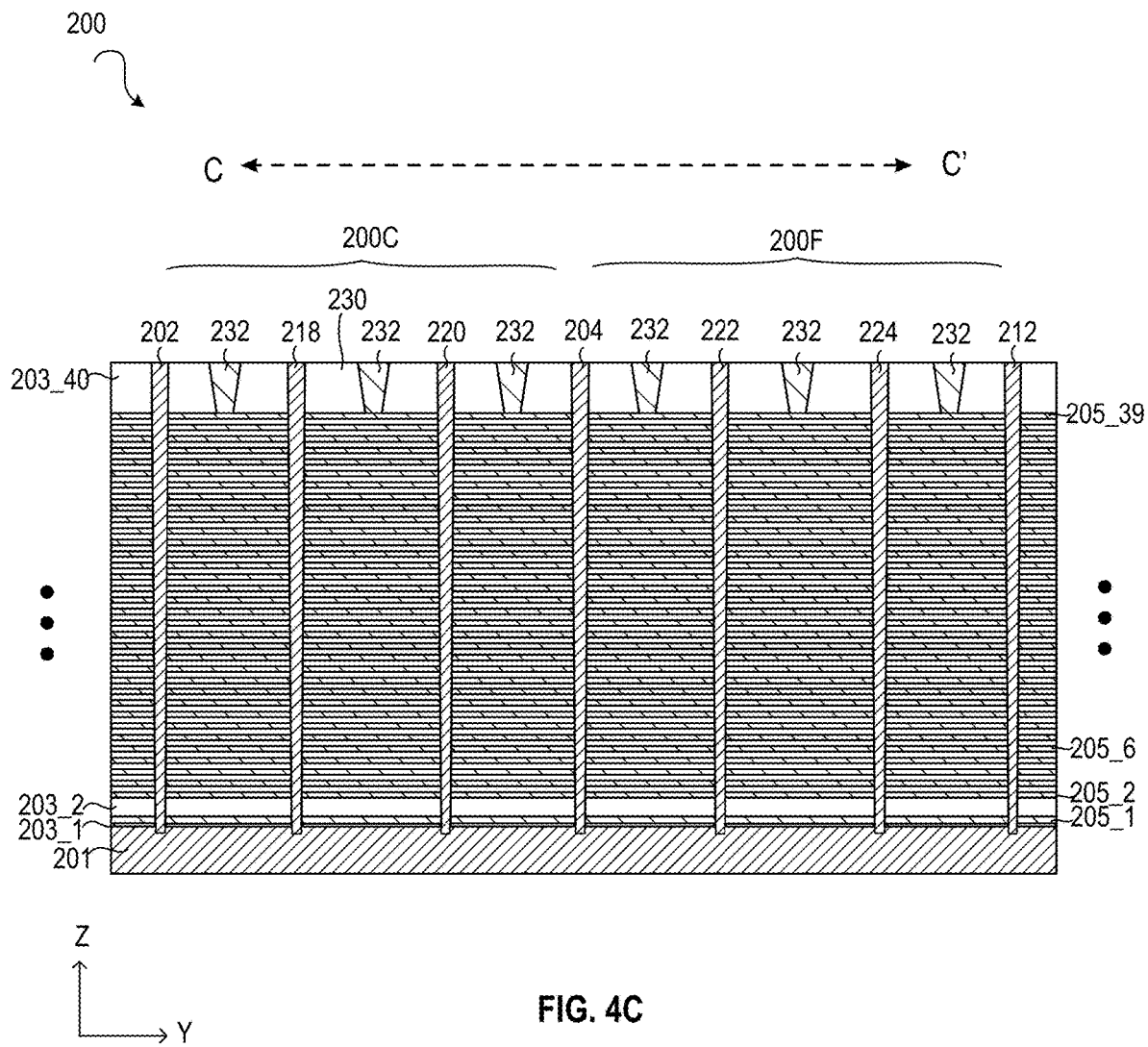
FIG. 4C is a third cross-sectional view of the second exemplary 3D NAND device, in accordance with exemplary embodiments of the disclosure.

FIG. 4B is a cross-sectional view of the device 200 that is obtained from a plane same as a vertical plane containing line B-B' in FIG. 3A. As shown in FIG. 4B, the connection separation structure 206 avoids extending through the void 207. FIG. 4C is a cross-sectional view of the device 200 that is obtained from a plane same as a vertical plane containing line C-C' in FIG. 3A. As shown in FIG. 4C, the GLS structures 218 and 220 are positioned in the first connection region 200C between first separation structure 202 and the array separation structure 204, and the GLS structures 222 and 224 are positioned in the second connection region 200F between the array separation structure 204 and the third separation structure 212. It should be noted a plurality of word line contacts 232 can be formed to be coupled to the word line layers (e.g., the word line layer 205_39) in the first connection region 200C and the second connection region 200F.

Figure 5:
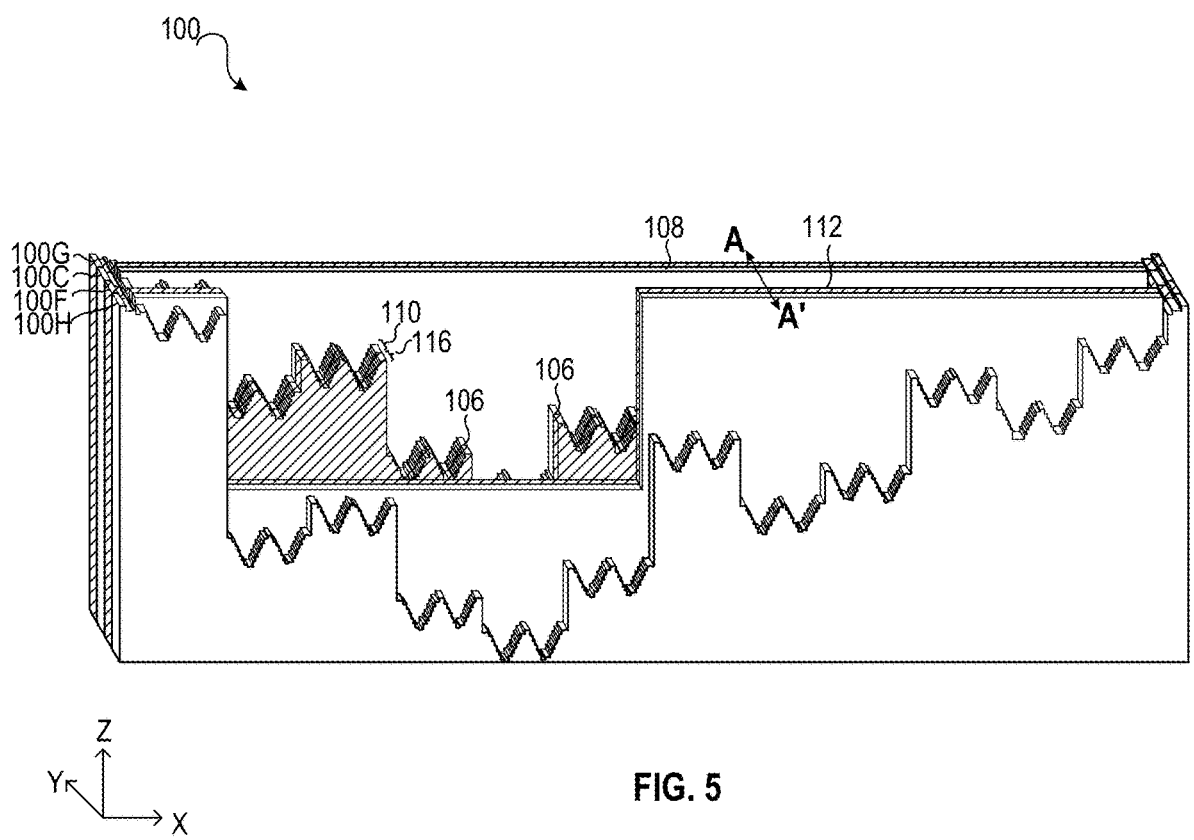
FIG. 5 is a three-dimensional view of an exemplary 3D NAND device, in accordance with exemplary embodiments of the disclosure.

FIG. 5 is three-dimensional view of connection regions of the 3D NAND device 100, in accordance with exemplary embodiments of the disclosure. As shown in FIG. 5, the device 100 can have a plurality of connection regions. For example, four exemplary connection regions 100G, 100C, 100F, and 100H are provided. Each of the connection regions can be included in a respective memory block of the device 100. The connection region (or first connection region) 100C can have the first wall structure 108 and the first staircase region 110. The connection region (or second connection region) 100F can include the second wall structure 114 and the second staircase region 116. The connection separation structure 106 is positioned between the first staircase region 110 and the second staircase region 116.

Figure 6A:
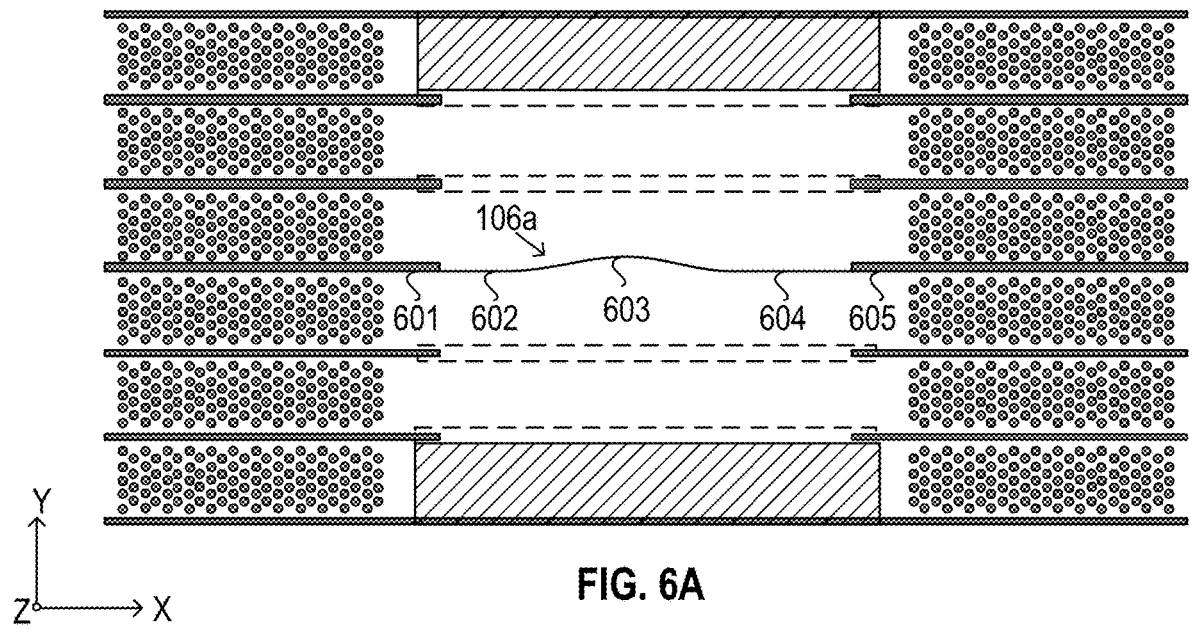
FIG. 6A is a top down view of a third exemplary 3D NAND device, in accordance with exemplary embodiments of the disclosure.

FIGS. 6A-6D illustrate other exemplary 3D NAND devices that can prevent an etching gouging or an undercut, in accordance with exemplary embodiments of the disclosure. As shown in FIG. 6A, a connection separation structure 106a with a curved top-down profile can be introduced. The curved top-down profile can allow the connection separation structure 106a detour a void (e.g., 107) positioned in an interface between a first connection region (e.g., 100C) and a second connection region (e.g., 100F). The curved top-down profile can include a first portion 602 with a straight top-down profile (e.g., a profile extending along X direction) that is in direct contact with a first array separation structure 601 of the array separation structures, a second portion 604 with the straight top-down profile that is in direct contact with a second array separation structure 605 of the array separation structures, and a third portion 603 with the curved profile (e.g., a profile being deviated from X direction) that is disposed between the first portion 602 and the second portion 604.

Figure 6B:
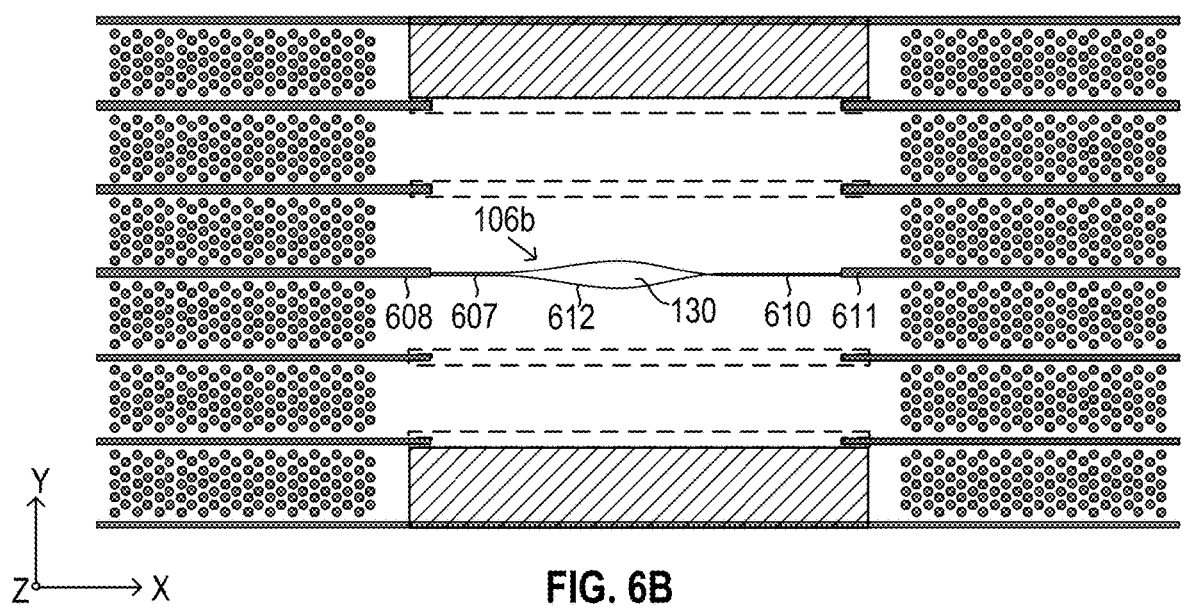
FIG. 6B is a top down view of a fourth exemplary 3D NAND device, in accordance with exemplary embodiments of the disclosure.

FIG. 6B illustrates a connection separation structure 106b that has an oval top-down profile. A void (e.g., 107) can be surrounded by the connection separation structure 106b so that the void can be intact during the formation of the connection separation structure 106b. The oval top-down profile can include a first portion 607 with a straight top-down profile (e.g., a profile extending along X direction) that is in direct contact with a first array separation structure 608 of the array separation structures, a second portion 610 with the straight top-down profile that is in direct contact with a second array separation structure 611 of the array separation structures, and a third portion 612 with the oval profile that is disposed between the first portion 607 and the second portion 610, and further covers a portion of a dielectric layer 130.

Figure 6C:
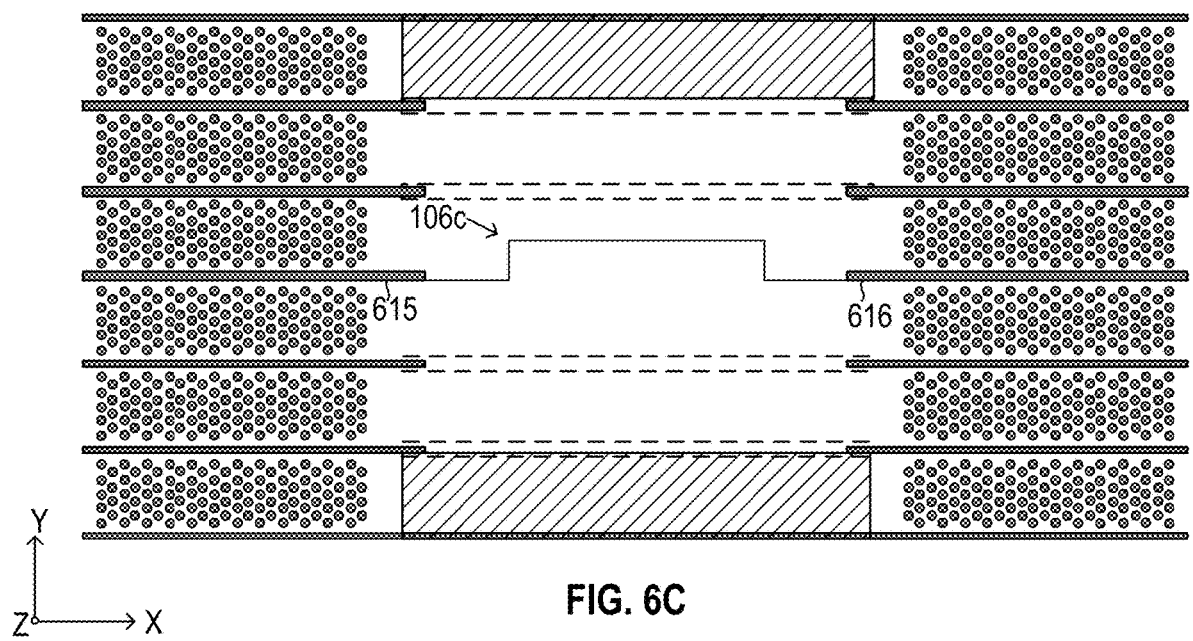
FIG. 6C is a top down view of a fifth exemplary 3D NAND device, in accordance with exemplary embodiments of the disclosure.

FIG. 6C illustrates a connection separation structure 106c that is positioned between array separation structures 615 and 616, and has a square wave top-down profile to detour a void.

Figure 6D:
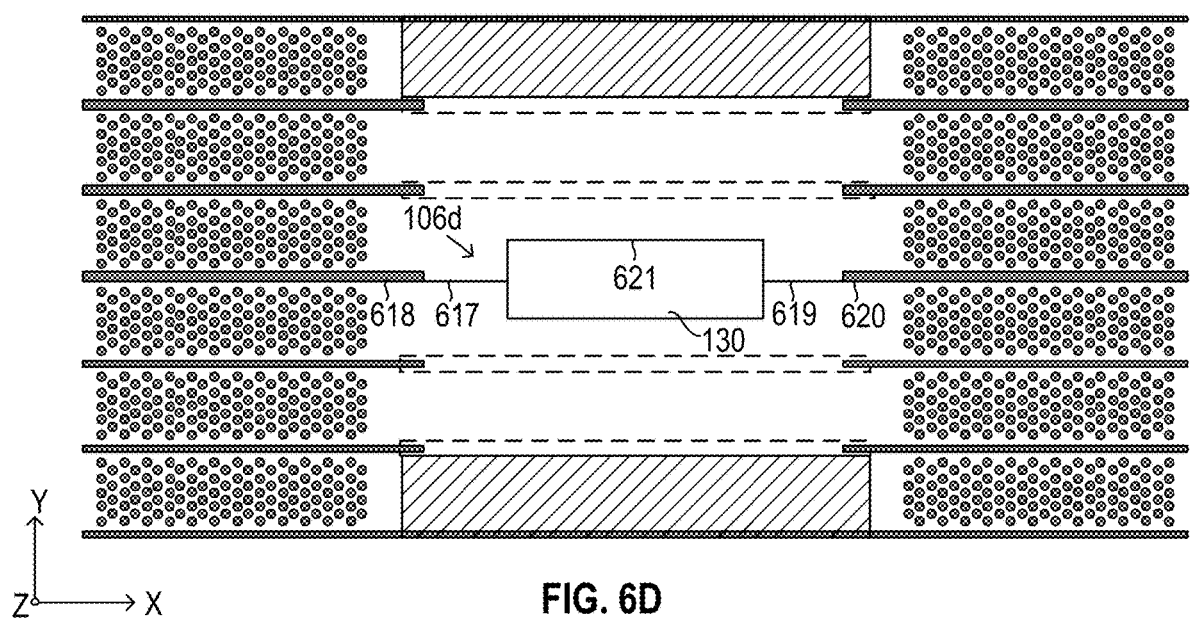
FIG. 6D is a top down view of a sixth exemplary 3D NAND device, in accordance with exemplary embodiments of the disclosure.

FIG. 6D illustrates a connection separation structure 106d that has a rectangle top-down profile to detour a void. The rectangle top-down profile can include a first portion 617 with a straight top-down profile (e.g., a profile extending along X direction) that is in direct contact with a first array separation structure 618 of the array separation structures, a second portion 619 with the straight top-down profile that is in direct contact with a second array separation structure 620 of the array separation structures, and a third portion 621 with the rectangle profile that is disposed between the first portion 617 and the second portion 619, and covers a portion of a dielectric layer 130.

Figure 7:
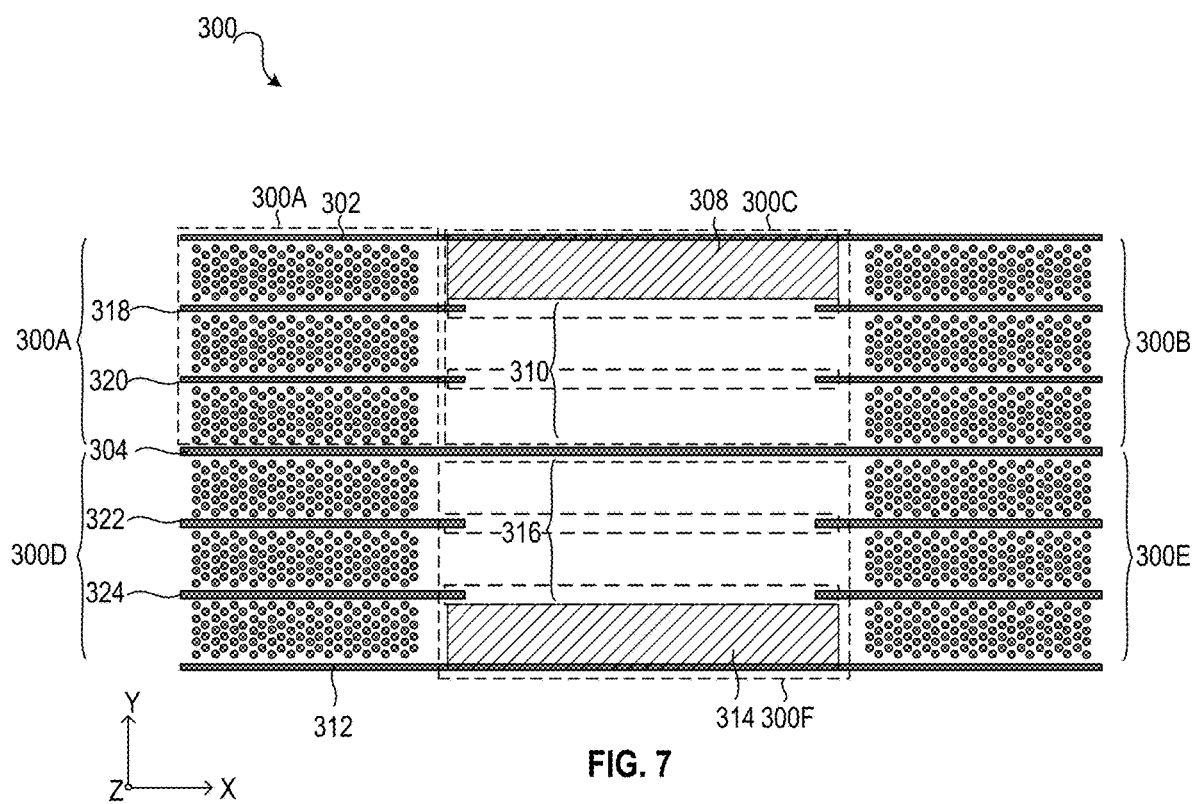
FIG. 7 is a top down view of a related 3D NAND device, in accordance with exemplary embodiments of the disclosure.

FIG. 7 is a top down view of a related 3D NAND device 300 (also referred to device 300). As shown in FIG. 7, the device 300 can have a first separation structure 302, a second separation structure 304, and a third separation structure 312 that extend in parallel along an X direction of a substrate (not shown). Comparing to the device 100, the second separation structure 304 is formed of a gate line slit structure that extends through first array regions 300A and 300B, and second array regions 300D and 300E. The second separation structure 304 also extends through a first connection structure 300C and a second connection structure 300F.

Figure 8:
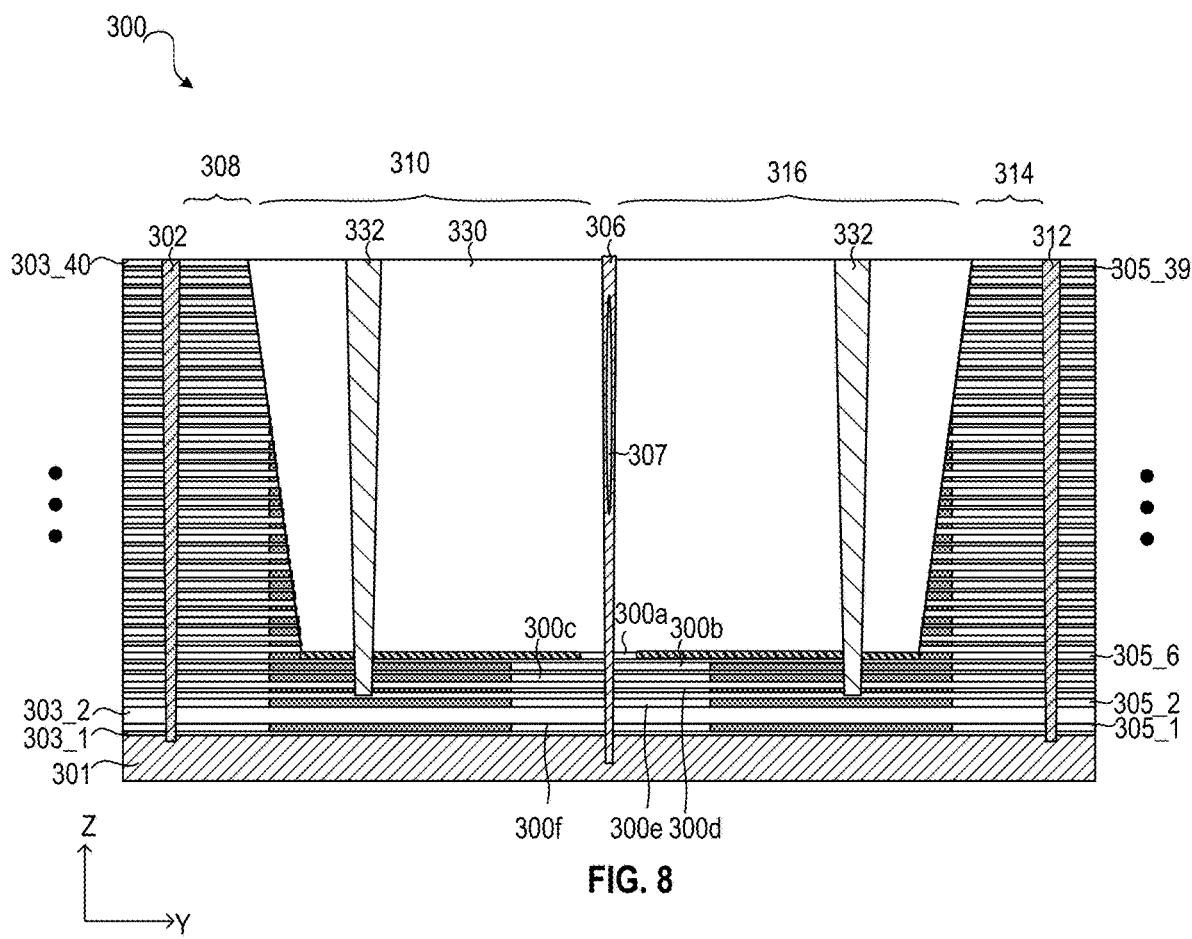
FIG. 8 is a cross-sectional view of the related 3D NAND device, in accordance with exemplary embodiments of the disclosure.

FIG. 8 is a cross-sectional view of the related 3D NAND device 300, in accordance with exemplary embodiments of the disclosure. The device 300 can include a stack that is formed of word line layers 305 and insulating layers 303. The word line layers 305 and the insulating layers 303 are stacked on a substrate 301 alternatingly. Similar to the device 100, the word line layers 305 can include conductive portions in a first wall structure 308 and a second wall structure 314, and dielectric portions in a first staircase region 310 and a second staircase region 316. A void 307 can be formed during a formation of a dielectric layer 330. In some embodiment, the void 307 can cause an etch gouging (or an undercut) around a bottom portion of the second separation structure 306 during a formation of the second separation structure 306. For example, undercuts 300a-300f can take place around the bottom portion of the second separation structure 306 in the word line layers 305_1 to 305_6. As shown in FIG. 8, portions of the word line layers 305_1 to 305_6 are etched away around the bottom portion of the second separation structure 306 during the formation of the second separation structure 306. The undercuts 300a-300f can cause reliability issues, and also impact subsequent manufacturing processes. For example, the undercuts can impact removal of sacrificial array common source (ACS) polysilicon during a sidewall selective epitaxy growth (SWS) process.

In the disclosure, the second separation structure can include two portions. A first portion can be array separation structures to extend through array regions, and a second portion can be a connection separation structure that is positioned in connection regions. The connection separation structure of the second separation structure can prevent an etch gouging or an undercut driven by a void that is formed in the connection regions. The connection separation structure can either be made through appropriate manufacturing processes and/or appropriate dimensions to prevent an expansion of the void during a formation of the connection separation structure as shown in FIG. 1, or can have profiles to detour the void as shown in FIGS. 2 and 6A-6D.

FIGS. 9A, 9B, and 10-13 are cross-sectional and top-down views of various intermediate steps of manufacturing a 3D NAND device, in accordance with exemplary embodiments of the disclosure.

Figure 9A:
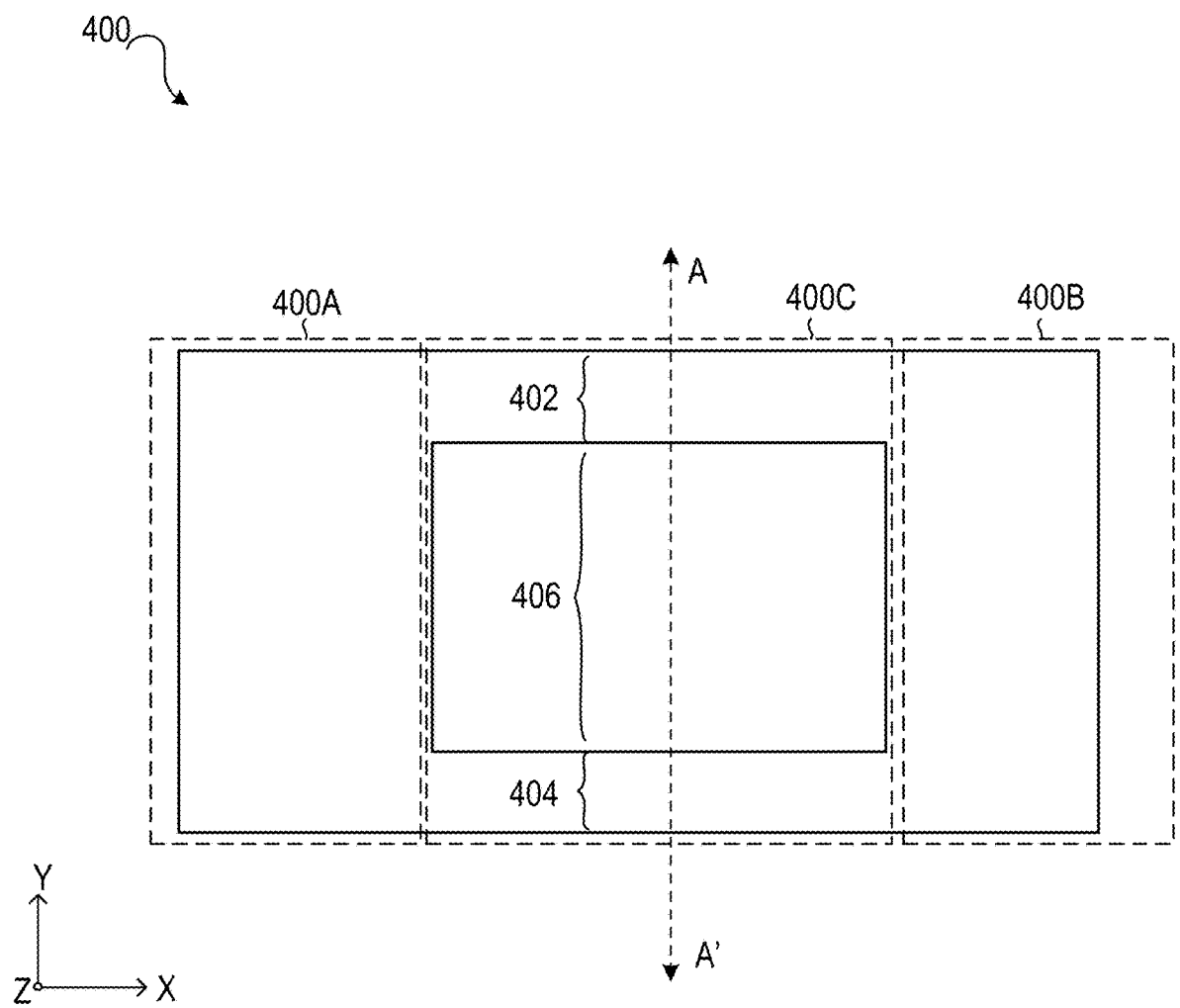
FIGS. 9A, 9B, 10, 11A, 11B and 12-13 are cross-sectional and top-down views of various intermediate steps of manufacturing a 3D NAND device, in accordance with exemplary embodiments of the disclosure.
Figure 9B:
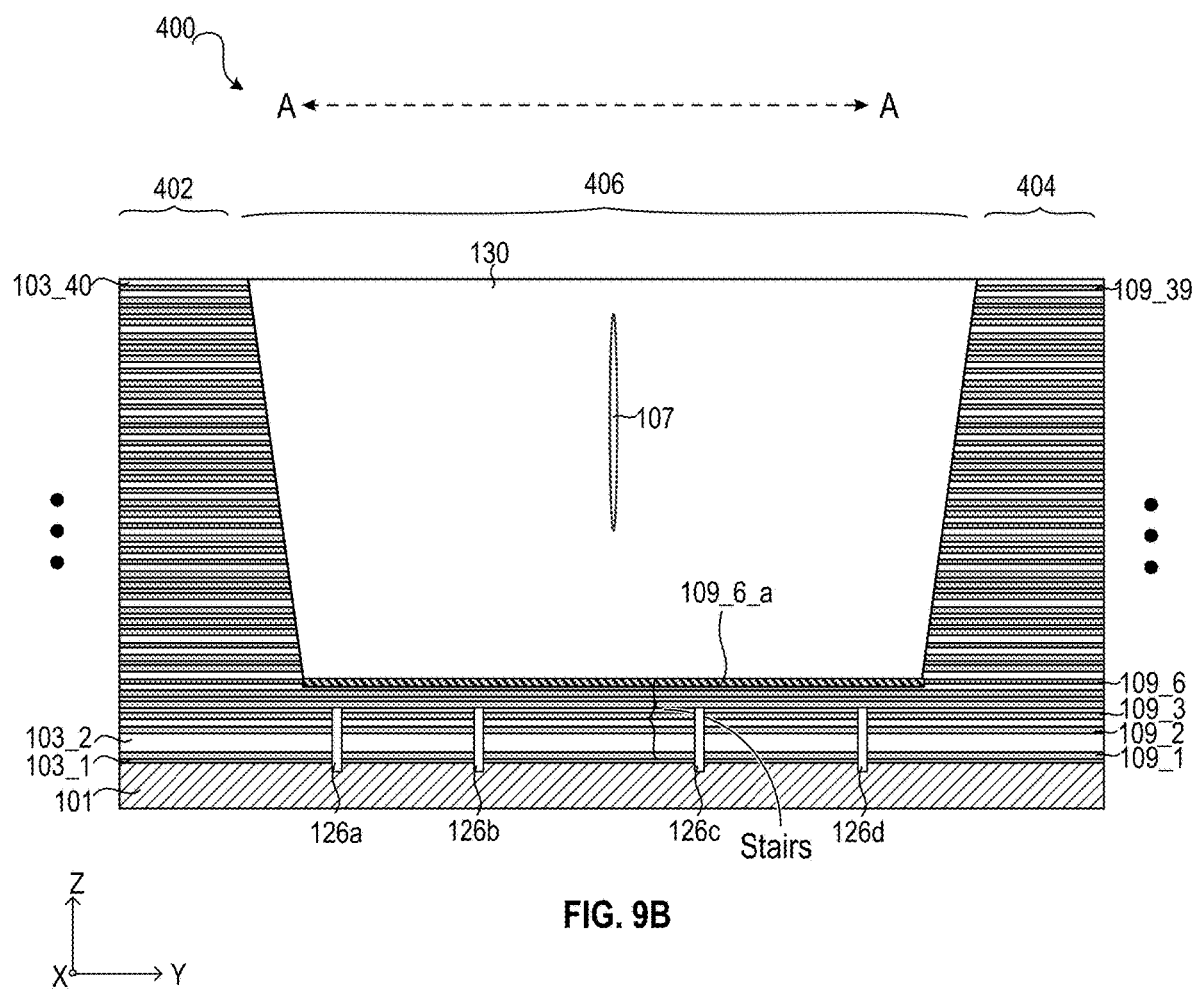

FIG. 9A is a top-down view of a semiconductor structure 400, and FIG. 9B is a cross-sectional view of the semiconductor structure 400 that is obtained from a plane same as a vertical plane containing line A-A' in FIG. 9A. As shown in FIG. 9A, the semiconductor structure 400 can have a connection region 400C that is positioned between the array regions 400A and 400B along an X direction of a substrate (not shown). The connection region 400C can have a first transition region 402, a staircase region 406 and a second transition region 404 that are disposed between the array regions 400A and 400B. The staircase region 406 is further arranged between the first transition region 402 and the second transition region 404.

As shown in FIG. 9B, the semiconductor structure 400 can include an initial stack. The initial stack can include sacrificial word line layers 109 and insulating layers 103 that are stacked alternatingly over a substrate 101. The semiconductor structure 400 can further include a plurality of bottom select gate (BSG)-cut structures (e.g., 126a-126d) that extends through one or more sacrificial word line layers (e.g., 109_1 to 109_3), and further extends along an X direction of the substrate 101. In an embodiment of FIG. 9B, 40 insulating layers 103 and 39 sacrificial word line layers 109 are included in semiconductor structure 400. However, FIG. 9 is merely an example, and any number of sacrificial word line layers and insulating layers can be introduced in the semiconductor structure 400 according to the architecture of 3D NAND device. The sacrificial word line layers 109 can be made of SiN, and the insulating layers 103 can be made of SiO, for example. Any suitable manufacturing processes can be applied to form the sacrificial word line layers 109 and the insulating layers 103, such as a chemical vapor deposition (CVD) process, a physical vapor deposition (PVD) process, an atomic layer deposition (ALD) process, a diffusion process, a sputter process, or a combination thereof.

Still referring to FIG. 9B, a staircase region 406 can be formed in the initial stack. The staircase region 406 can be positioned between a first transition region 402 and a second transition region 404. The staircase region 406 can include a plurality of stairs. The stairs can expose each of the sacrificial word line layers so that word line contacts can land on word line layers once the sacrificial word line layers are replaced by the word line layers in subsequent manufacturing steps. In order to form the stairs, a trim-etching process or a photolithography-etching process can be operated in the staircase region 406 of the initial stack. Once the stairs are formed, tread portions (i.e., exposed sacrificial word line layers to receive the word line contacts) of the stairs can receive an ion implantation process. Accordingly, the tread portions of the stairs can have a different etch rate comparing to the sacrificial word line layers of the stairs that do not receive the ion implantation process. In an exemplary embodiment of FIG. 9B, a tread portion 109_6_a of a stair that exposes the sacrificial word line layer 109_6 can receive the ion implantation.

A dielectric layer 130 can subsequently be deposited to fill gaps between the first transition region 402 and the second transition region 404 in the staircase region 406. The dielectric layer 130 can be positioned between the first transition region 402 and the second transition region 404, and further disposed over the stairs in the staircase region 406. The dielectric layer 130 can include tetraethyl orthosilicate (TEOS), SiN, SiO, SiCN or other suitable dielectric materials. The dielectric layer 130 can be formed through a CVD process, a PVD process, an ALD process, a diffusion process, a sputter process, or a combination thereof. In some embodiments, a void 107 can be formed in a top portion of the dielectric layer 130 along a Z direction. The void 107 can further be positioned at an approximate center position of the staircase region 406 along a Y direction. A void can normally take place in a film when the film is deposited into a gap that has a certain aspect ratio of a top critical dimension (CD) and a height.

Figure 10:
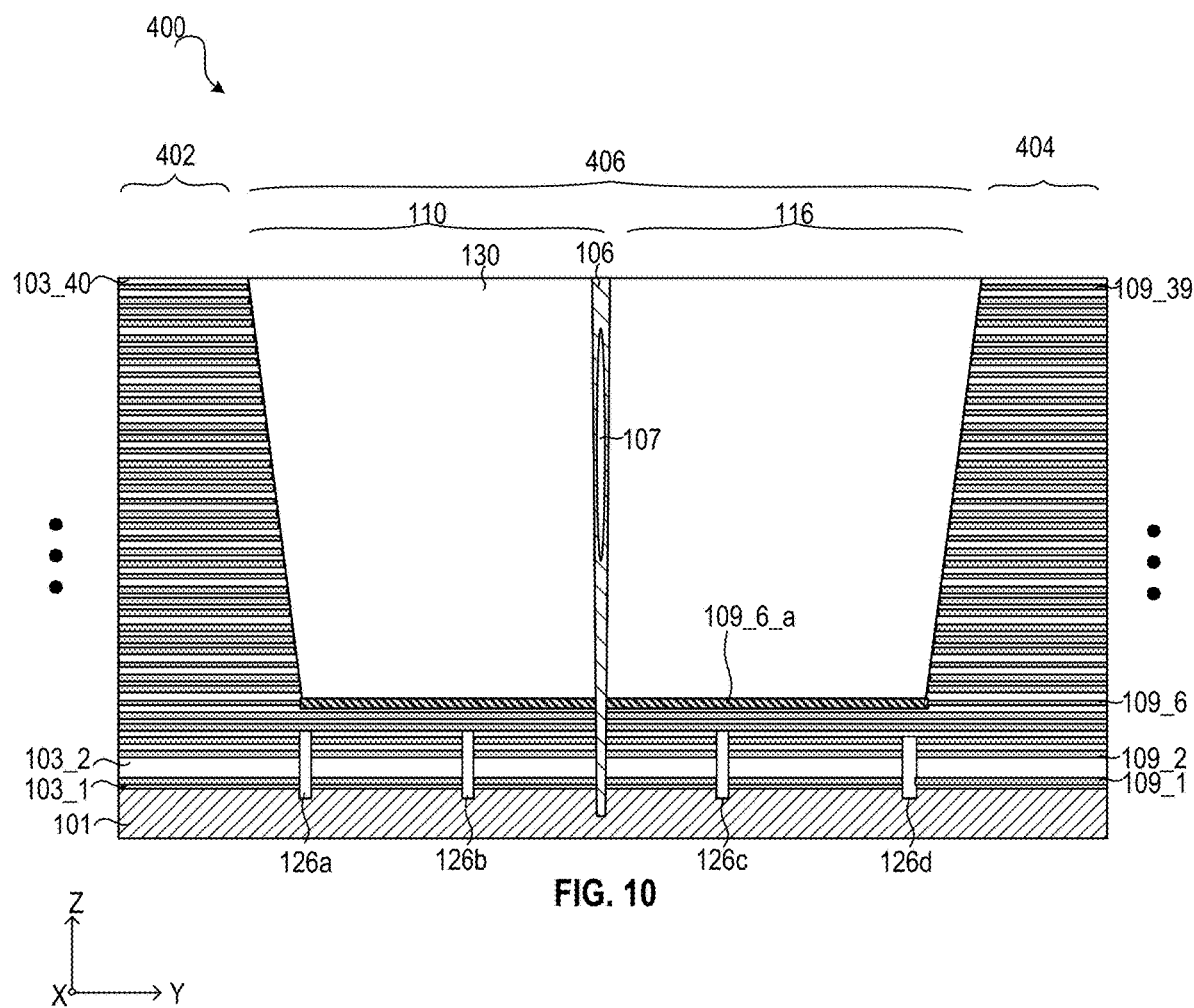

In FIG. 10, a dummy structure (or connection separation structure) 106 can be formed in the staircase region 406. In some embodiments, the dummy structure 106 can include a trench structure and a plurality of dummy channel structures that are disposed along the trench structure and spaced apart from one another. The dummy channel structures can have a pillar shape, such as an oval-pillar shape or a circular-pillar shape. Sidewalls of the dummy channel structures can protrude from sidewalls of the trench structure so that sidewalls of the dummy structure 106 along the X direction can include flat surfaces and curved surfaces that are disposed alternatingly along the X direction. Accordingly, sidewalls of the dummy structure (or connection separation structure) 106 can include protruding portions (e.g., sidewalls of the dummy channel structures) along a first direction that is deviated from X direction, such as Y direction. In addition, the sidewalls of the dummy structure 106 can include first portions (e.g., sidewalls of the trench structures) and second portions (e.g., sidewalls of the dummy channel structures) arranged alternatingly. The second portions protrude along the first direction (e.g., Y direction). The dummy structure 106 can extend through the sacrificial word line layers and insulating layers of the staircase region 406, and further extend along the X direction of the substrate 101. The dummy structure 106 can further be disposed at the center of the staircase region 406 along the Y direction so that the dummy structure 106 can extend through the void 107. Accordingly, the staircase region 406 can be divided into a first staircase region 110 and a second staircase region 116. In some embodiments, the dummy structure 106 can be configured to serve as a connection separation structure 106. In order to form the dummy structure 106, a dummy channel trench and dummy channel holes (not shown) can be formed through a combination of a photolithography process and an etching process, where the dummy channel holes are disposed along the dummy channel trench and spaced apart from one another. Sidewalls of the dummy channel holes can protrude from sidewalls of the dummy channel trench. The photolithography process can apply a mask layer over a top surface of the dielectric layer 130, and the etching process can be applied subsequently to form the dummy channel trench and dummy channel holes based on the mask layer. The dummy channel trench and dummy channel holes can extend through the sacrificial word line layers in the staircase region 406 and further extend along the X direction. A dielectric layer, such as SiO or SiN, can be deposited into the dummy channel trench and dummy channel holes to form the dummy structure 106. During the formation of the dummy structure 106, an appropriate etching process and an appropriate dimension of the dummy channel trench can be applied to prevent any undercut driven by the void 107. It should be noted that the dummy structures that are illustrated in FIGS. 3 and 6A-6D can be formed through a similar manufacturing process to the manufacturing process in FIG. 10.

Figure 11A:
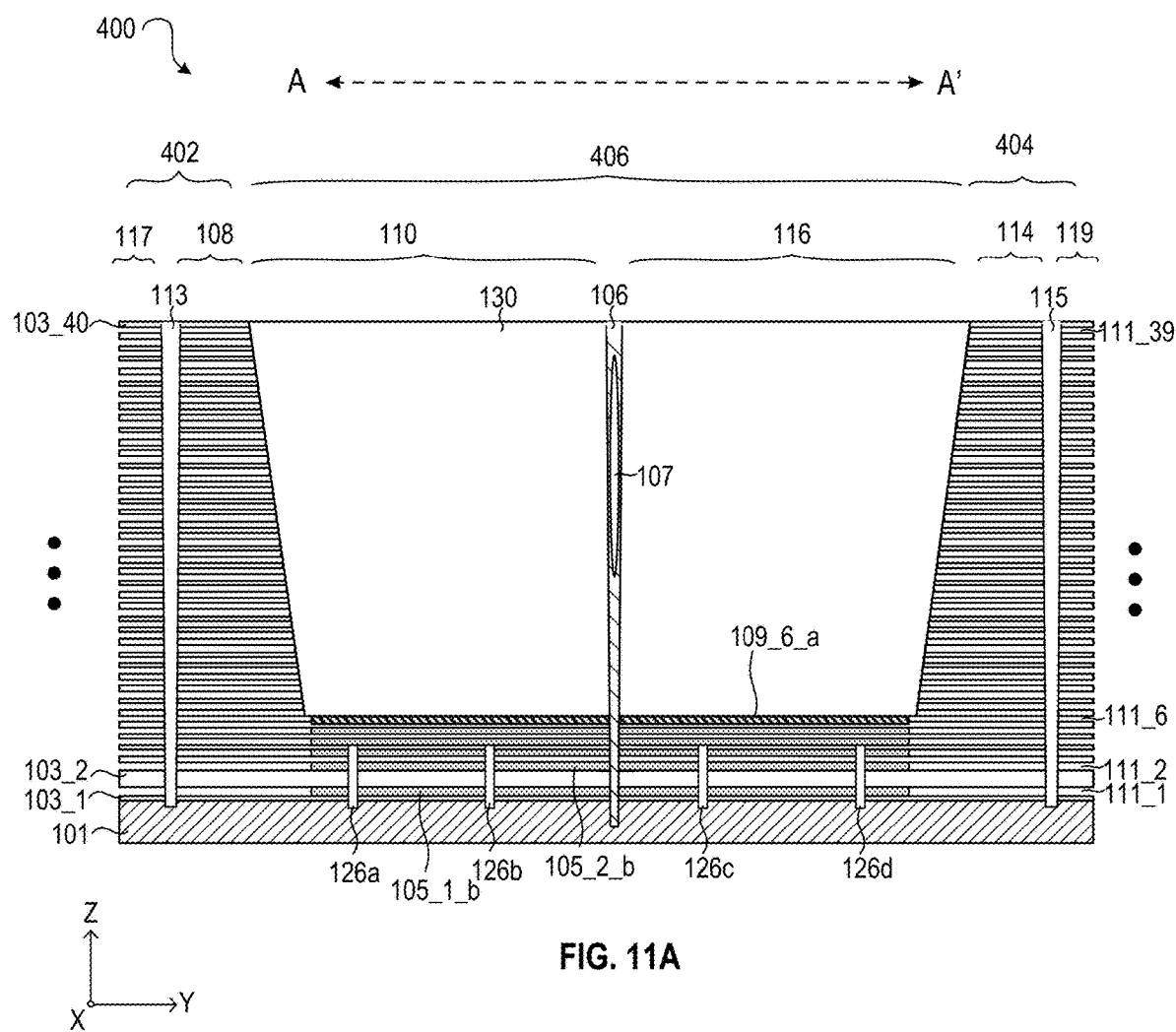
Figure 11B:
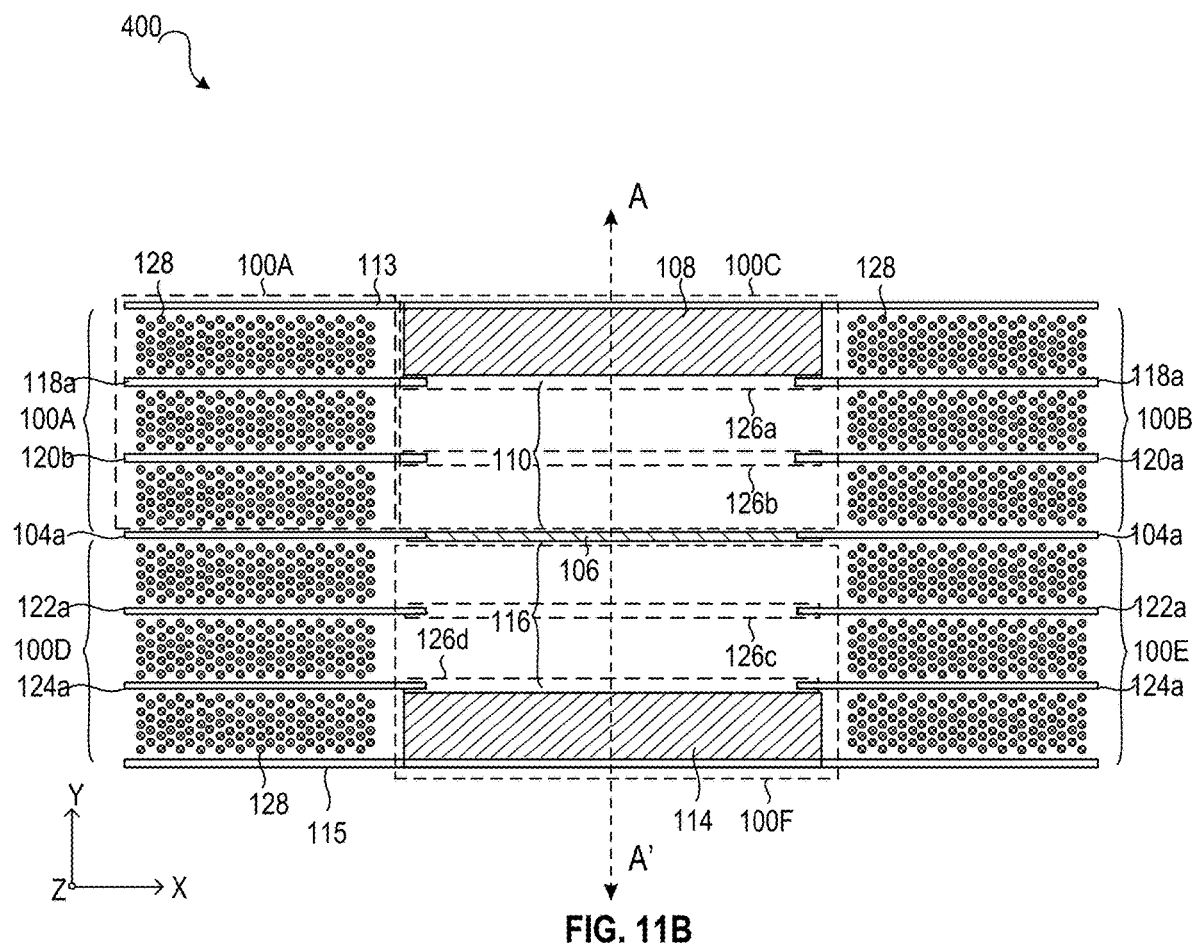

FIGS. 11A and 11B illustrate the formation of GLS trenches. FIG. 11B is a top down view and FIG. 11A is a cross-sectional view that is obtained from a plane same as a vertical plane containing line A-A' in FIG. 11B. In FIG. 11A, a plurality of GLS trenches can be formed through a combination of a photolithography process and an etching process. The GLS trenches can be formed in the first transition region 402 and the second transition region 404. The GLS trenches can further be formed in array regions of the semiconductor structure 400 that can be shown in FIG.

11B. In an embodiment of FIG. 11A, the GLS trenches can include a first separation trench 113 and a third separation trench 115. The first separation trench 113 can be positioned in the first transition region 402 and extend through the stack into the substrate 101. Accordingly the first transition region 402 can be divided into a first wall structure 108 and a third wall structure 117. The first separation trench 113 can further extend along the X direction of the substrate 101. The third separation trench 115 can be positioned in the second transition region 404 and extend through the stack into the substrate 101. Accordingly the second transition region 404 can be divided into a second wall structure 114 and a fourth wall structure 119. The third separation trench 115 can further extend along the X direction of the substrate 101.

As shown in FIG. 11B, the GLS trenches can include array separation trenches 104a that are aligned with the connection separation structure 106. The GLS trenches can also include GLS trenches 118a and 120a that are positioned between the first separation trench 113 and the array separation trench 104a, and GLS trenches 122a and 124a that are positioned between the array separation trench 104a and the third separation trench 115. Once the GLS trenches are formed, the array regions 400A and 400B are divided into first array regions 100A and 100B, and second array regions 100D and 100E by the GLS trenches as shown in FIG. 11B.

In some embodiments, before the GLS trenches are formed, a plurality of channel structures 128 can be formed in the array regions 400A and 400B of the semiconductor structure 400. As shown in FIG. 11B, the channel structures 128 can extend through the sacrificial word line layers and insulating layers of the initial stack. The channel structures 128 can have a bottom channel contact (not shown) extending into the substrate. The channel structure can also have a channel layer, a tunneling layer, a charge trapping layer and a barrier layer that are positioned over the bottom channel contact, where the tunneling layer can surrounds the channel layer, the charge trapping layer can that surround the tunneling layer, and the barrier layer can surround the charge trapping layer and further be in direct contact with the sacrificial word line layers.

Still referring to FIG. 11A, a first wet etching process can subsequently be performed to remove the sacrificial word line layers that are position in the first transition region 402, the second transition region 404, and the array regions (not shown). In order to remove the sacrificial word line layers that are position in the first transition region 402, the second transition region 404, and the array regions, a wet acid (e.g., a phosphoric acid) can be poured into the GLS trenches (e.g., the first separation trench 113 and the third separation trench 115) so that the sacrificial word line layers can be etched away. The first wet etching process can be controlled through a process time and/or process temperature to precisely remove the sacrificial word line layers that are positioned in the first transition region 402, the second transition region 404, and the array regions (not shown) so that a plurality of vacancies 111 can be formed. In addition, the sacrificial word line layers that are positioned in the staircase region 406 can still remain.

Figure 12:
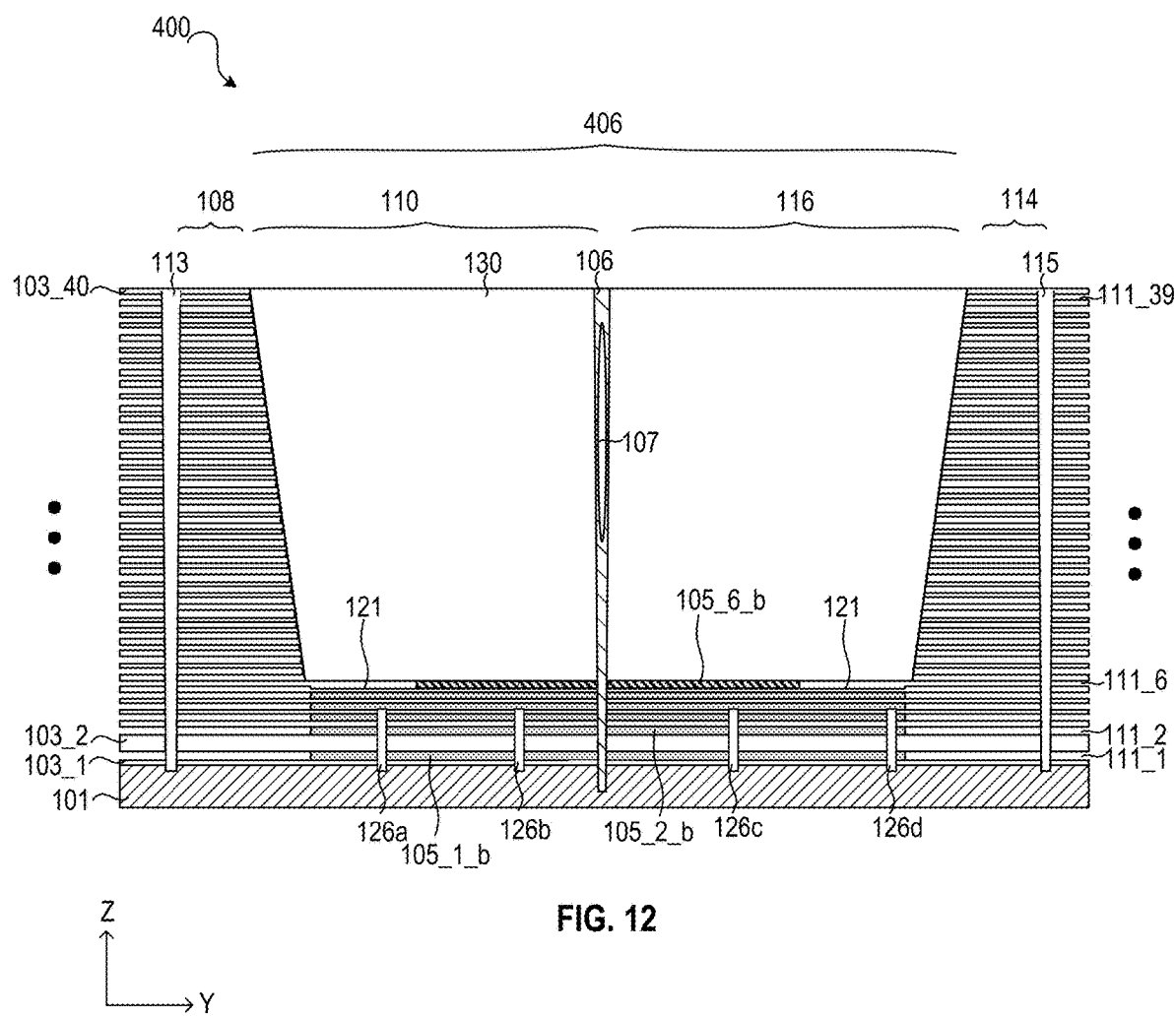

In FIG. 12, a second wet etching process can be applied to remove side portions of the sacrificial word line layers that are disposed in tread positions of stairs of the staircase region 406. For example, the sacrificial word line layer 109_6_a that is disposed in a tread position of a stair of the staircase region 406 can be etched by the second wet etching process partially by remove side portions. When the second etching process is completed, the side portions of the sacrificial word line layer 109_6_a are removed, and the remaining sacrificial word line layer 109_6_a becomes 105_6_b. In addition, vacancies 121 can be formed in the removed side portions of the sacrificial word line layer 109_6_a. As mentioned above, the sacrificial word line layers that are disposed in the tread positions of the stairs of the staircase region 406 can receive an ion implantation treatment. Accordingly, the sacrificial word line layers that are disposed in the tread positions of the stairs of the staircase region 406 can have a different etch rate from the sacrificial word line layers that are positioned in non-tread portions of the stairs of the staircase region 406. Thus, the second wet etching process can apply a wet acid that can selectively etch the sacrificial word line layers that are disposed in the tread positions of the stairs of the staircase region 406.

Figure 13:
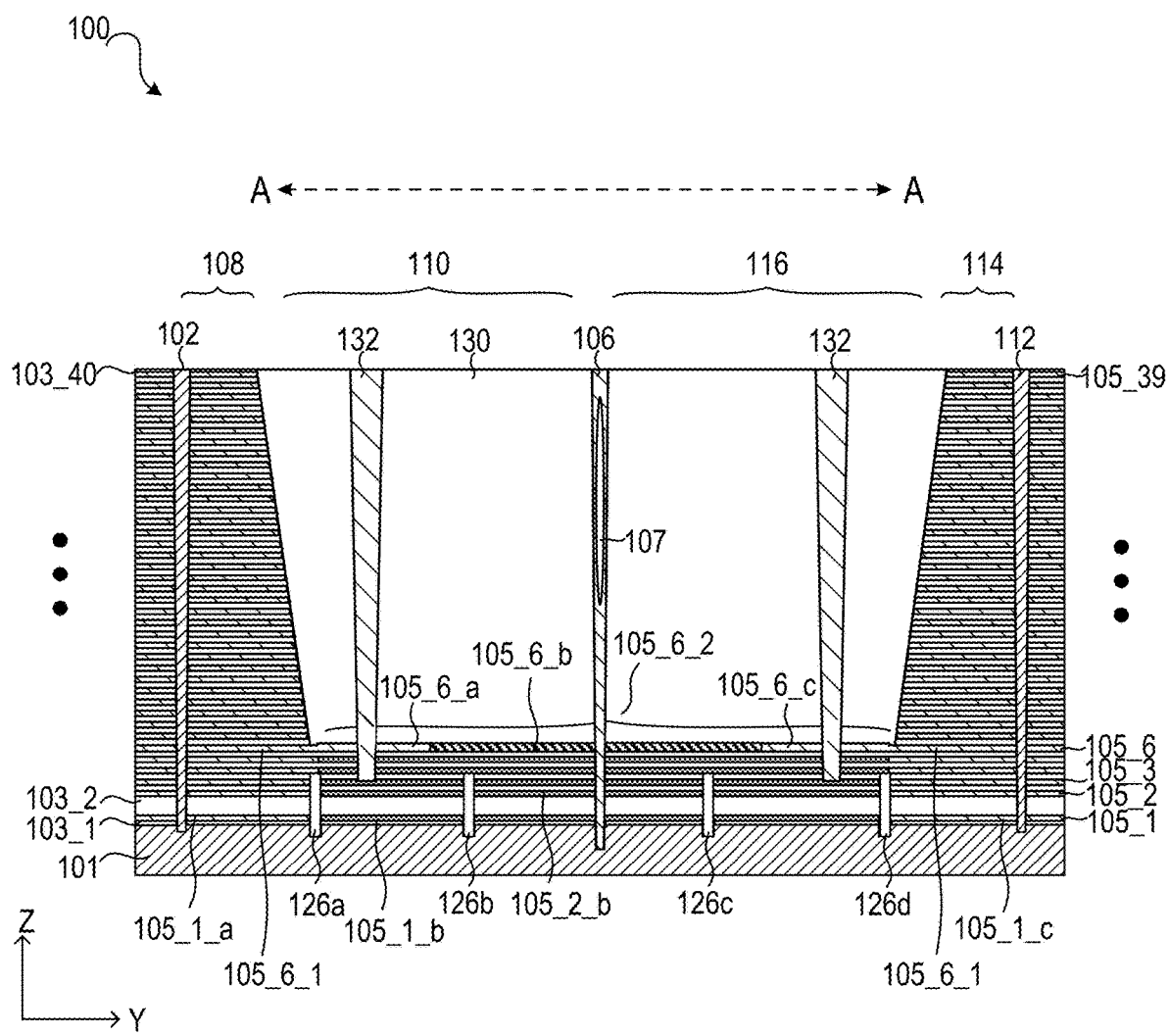

In FIG. 13, a first conductive material can be deposited to fill the vacancies 111 and 121. The first conductive material can be tungsten, polysilicon or other suitable conductive materials. The deposition process can be a CVD process, an ALD process, a diffusion process, or other suitable deposition process. When the first conductive material is deposited to fill the vacancies 111 and 121, word line layers 105 can be formed. As shown in FIG. 13, the word line layers 105 can include conductive portions and dielectric portions. For example, the word line layer 105_39 can be made of tungsten (W) or polysilicon. The word line layer 105_1 can include conductive portions 105_1_a and 105_1_c that are disposed in the first wall structure 108, and the second wall structure 114 respective. The word line layer 105_1 can further have a dielectric portion 105_1_b that is positioned in the first staircase region 110 and the second staircase region 116. The word line layer 105_6 can include first portions 105_6_1 and a second portion 105_6_2. The first portions 105_6_1 are disposed in the first wall structure 108 and the second wall structure 114, and made of tungsten. The second portion 105_6_2 that is disposed in the first staircase region 110 and the second staircase region 116 can further include conductive regions (e.g., 105_6_a and 105_6_c) and a dielectric region (e.g., 105_6_b).

Still referring to FIG. 13, a second conductive material, such as polysilicon, can be deposited into the first separation trench 113 and the third separation trench 115 to form the first separation structure 102 and the third separation structure 112 respectively. The second conductive material can also fill the array separation trenches 104a to form the array separation structure 104, and fill the GLS trenches 118a, 120a, 122a, and 124a to form the GLS structures 118-124 respectively. In some embodiments, array common source (ACS) regions (not shown) can be formed under bottom portions of the first separation trench 113, the third separation trench 115, the array separation trenches 104a, and the GLS trenches 118a, 120a, 122a, and 124a. Accordingly, the first separation structure 102, the third separation structure 112, the array separation structure 104 and the GLS structures 118-124 can be configured to function as contact terminals to access the ACS regions.

Further, a plurality of word line contacts 132 can be formed. The word line contacts 132 can be made of W with a pillar shape. The word line contacts 132 can land on the tread portions of the stairs in the first staircase region 110 and the second staircase region 116 so as to be coupled to the word line layers in the first staircase region 110 and the second staircase region 116. For example, the second portion 105_6_2 of the word line layer 105_6 can be a tread portion of a stair in the first staircase region 110 and the second staircase region 116. The word line contacts 132 can land on the conductive regions (e.g., 105_6_a and 105_6_c) of the second portion 105_6_2 of the word line layer 105_6 so as to be coupled to the word line layer 105_6. In some embodiments, the word line contacts 132 can further extend through the conductive regions and extend into dielectric portions of underlying word line layers (e.g., 105_3). When the word line contacts 132 are manufactured, a 3D NAND device 100 is formed. The 3D NAND device 100 illustrated in FIG. 13 can have similar configurations to the 3D NAND device 100 illustrated in FIGS. 1 and 2.

Figure 14:
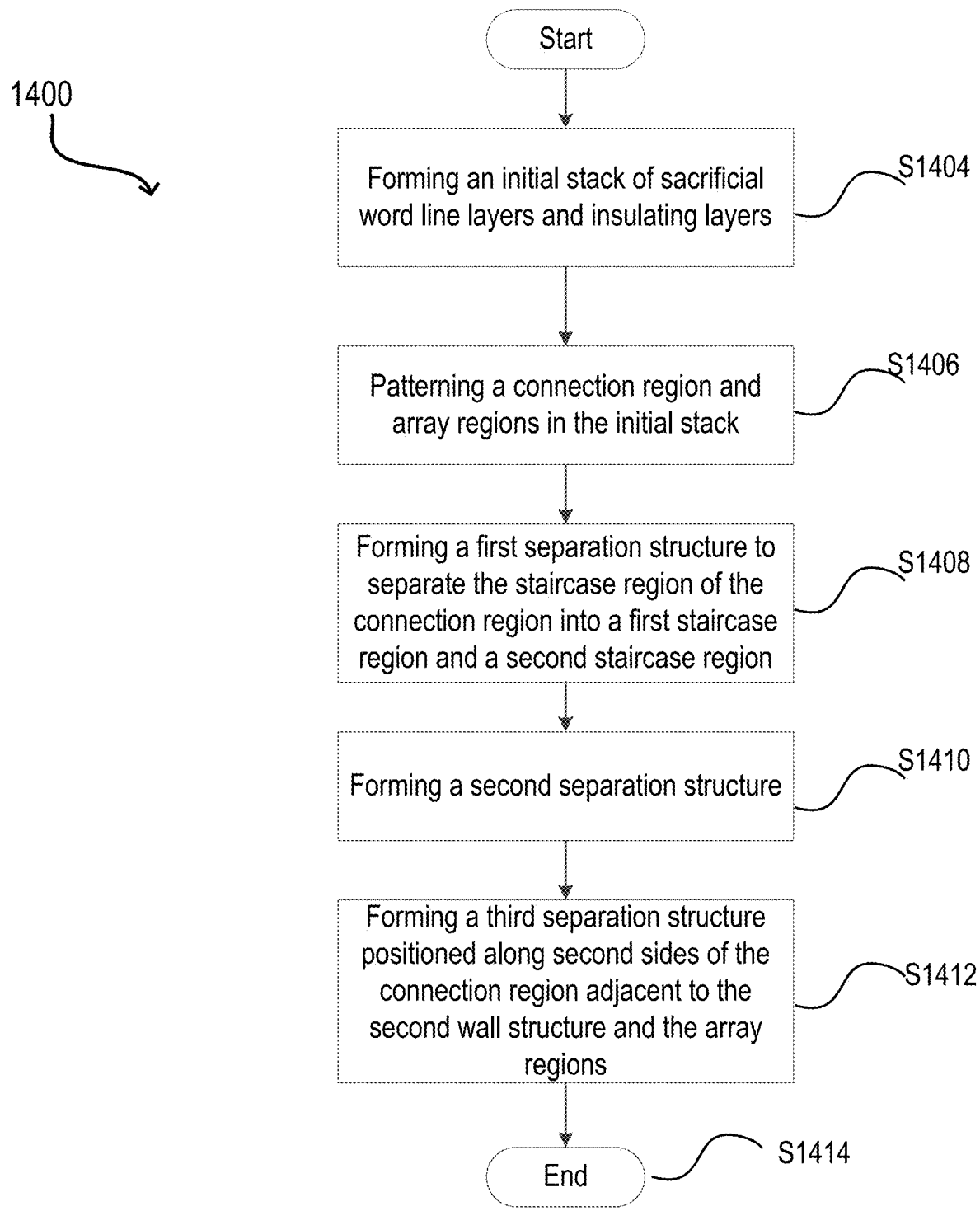
FIG. 14 is a flowchart of a process for manufacturing a 3D NAND device, in accordance with exemplary embodiments of the disclosure.

FIG. 14 is a flowchart of a process 1400 for manufacturing the disclosed 3D NAND device in accordance with some embodiments of the present disclosure. The process 1400 begins at step S1404 where an initial stack of sacrificial word line layers and insulating layers can be formed over a substrate of the 3D NAND device. At step S1406, a connection region and array regions in the initial stack can be formed. The connection region can be disposed between the array regions, and include a staircase region, a first wall structure, and a second wall structure that extend between the array regions. The staircase region can be further disposed between the first wall structure and the second wall structure. In some embodiments, the steps S1404 and S1406 can be performed as illustrated with reference to FIGS. 9A and 9B.

The process 1400 then proceeds to step S1408 where a first separation structure (or dummy structure) can be formed to separate the staircase region of the connection region into a first staircase region and a second staircase region. The first separation structure can be positioned between the array regions, and extend in the vertical direction through the initial stack into the substrate. In some embodiments, the step S1408 can be performed as illustrated with reference to FIG. 10.

In step S1410 of the process 1400, a second separation structure can be formed. The second separation structure can be positioned along first sides of the connection region adjacent to the first wall structure and the array regions. The second separation structure can further extend in the vertical direction through the initial stack into the substrate. In step S1412, a third separation structure can be positioned along second sides of the connection region adjacent to the second wall structure and the array regions. The third separation structure can further extend in the vertical direction through the initial stack into the substrate. In some embodiments, the steps S1410 and S1412 can be performed as illustrated with reference to FIGS. 11A-11B, and 12-13.

It should be noted that additional steps can be provided before, during, and after the process 1400, and some of the steps described can be replaced, eliminated, or performed in different order for additional embodiments of the process 1400. For example, the second separation structure and the third separation structure can be formed before the first separation structure (or dummy structure) is formed. In another example, before the first separation structure and the second separation structure are formed, channel structures can be formed in array regions of the initial stack, where the channel structures extend from the substrate and extend through the sacrificial word line layers and the insulating layers in the array regions. Further, word line contacts can be formed on the first staircase region and the second staircase region after the first separation structure and the second separation structure are formed.

Moreover, various additional interconnect structures (e.g., metallization layers having conductive lines and/or vias) may be formed over the first and second contact structures of the 3D NAND device. Such interconnect structures electrically connect the 3D NAND device with other contact structures and/or active devices to form functional circuits. Additional device features such as passivation layers, input/output structures, and the like may also be formed.

The various embodiments described herein offer several advantages over related 3D NAND devices. For example, in the present disclosure, a 3D NAND device can have a connection region that is positioned between two array regions. A first separation structure (e.g., a dummy structure) is introduced to separate the connection region and second separation structures (e.g., gate line slit structures) are introduced to separate the array regions. The first separation structure and the second separation structure are aligned with each other. The first separation structure can prevent an etching gouging or an undercut that is driven by a void formed in a top portion of the connection region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a stack including word line layers and insulating layers that are alternatingly arranged in a vertical direction over a substrate;
   a first connection region arranged between first array regions of a first block formed in the stack;
   a first separation structure positioned along first sides of the first connection region and the first array regions, the first separation structure extending in the vertical direction through the stack into the substrate; and
   a second separation structure positioned along opposing second sides of the first connection region and the first array regions, the second separation structure including array separation structures positioned along the second sides of the first array regions and a connection separation structure positioned along the second side of the first connection region, the connection separation structure being arranged between the array separation structures, and further extending in the vertical direction through the stack into the substrate.

2. The semiconductor device of claim 1, wherein the connection separation structure has a top-down profile that is one of a straight profile, a curved profile, or a square wave profile.

3. The semiconductor device of claim 1, wherein the connection separation structure has a top-down profile that is discontinuous profile, the discontinuous profile including a first portion disposed adjacent to a first array separation structure of the array separation structures, and an opposing second portion disposed adjacent to a second array separation structure of the array separation structures.

4. The semiconductor device of claim 1, wherein the connection separation structure has a top-down profile that comprises a first portion with a straight profile being in direct contact with one a first array separation structure of the array separation structures, a second portion with the straight profile being in direct contact with a second array separation structure of the array separation structures, and a third portion positioned between the first portion and the second portion.

5. The semiconductor device of claim 4, wherein the third portion has a profile that is one of an oval profile, a square profile, or a rectangle square.

6. The semiconductor device of claim 1, wherein sidewalls of the connection separation structure comprise protruding portions along a first direction.

7. The semiconductor device of claim 6, wherein the sidewalls of the connection separation structure comprise first portions and second portions arranged alternatingly, the second portions protruding along the first direction.

8. The semiconductor device of claim 1, wherein the connection separation structure comprises at least one of SiN, SiO, or SiCN, and the array separation structures comprises at least one of polysilicon, tungsten, cobalt, ruthenium, copper or aluminium.

9. The semiconductor device of claim 1, wherein the first connection region further comprises:
   a first wall structure positioned along the first separation structure and extending between the first array regions, and
   a first staircase region positioned between the first wall structure and the connection separation structure and extending between the first array regions.

10. The semiconductor device of claim 9, further comprising:
   a second connection region arranged between second array regions of a second block formed in the stack; and
   a third separation structure positioned along first sides of the second connection region and the second array regions, the third separation structure extending in the vertical direction through the stack into the substrate, wherein:
   the second separation structure is positioned between the first block and the second block, and extend along opposing second sides of the second connection region and the second array regions;
   the array separation structures of the second separation structure are positioned along the second sides of the second array regions, and arranged between the first array regions and the second array regions; and
   the connection separation structure of the second separation structure is positioned along the second side of the second connection region, and arranged between the first connection region and the second connection region, wherein:
   a second wall structure positioned along the third separation structure and extending between the second array regions, and
   a second staircase region positioned between the second wall structure and the connection separation structure, the second staircase region being disposed between the second array regions, the second staircase region being spaced apart from the first staircase region by the connection separation structure.

* * * * *